US010332908B2

(12) United States Patent
Lee

(10) Patent No.: US 10,332,908 B2
(45) Date of Patent: Jun. 25, 2019

(54) THREE-DIMENSIONAL SEMICONDUCTOR DEVICE

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/953,969

(22) Filed: Apr. 16, 2018

(65) Prior Publication Data

US 2019/0027492 A1   Jan. 24, 2019

(30) Foreign Application Priority Data

Jul. 21, 2017 (KR) .................. 10-2017-0092484
Feb. 7, 2018 (KR) .................. 10-2018-0015195

(51) Int. Cl.

| H01L 27/11582 | (2017.01) |
| H01L 27/11524 | (2017.01) |
| H01L 27/11556 | (2017.01) |
| H01L 21/768 | (2006.01) |
| H01L 23/528 | (2006.01) |
| H01L 23/522 | (2006.01) |
| H01L 27/1157 | (2017.01) |

(52) U.S. Cl.
CPC .. *H01L 27/11582* (2013.01); *H01L 21/76816* (2013.01); *H01L 21/76877* (2013.01); *H01L 23/528* (2013.01); *H01L 23/5226* (2013.01); *H01L 27/1157* (2013.01); *H01L 27/11524* (2013.01); *H01L 27/11556* (2013.01)

(58) Field of Classification Search
None
See application file for complete search history.

(56) References Cited

U.S. PATENT DOCUMENTS

| 2012/0146122 A1* | 6/2012 | Whang ............... H01L 29/7889 257/315 |
| 2015/0044835 A1 | 2/2015 | Hattori et al. |
| 2016/0079267 A1* | 3/2016 | Fukuzumi ......... H01L 27/11582 257/314 |

FOREIGN PATENT DOCUMENTS

KR   1020140091249 A   7/2014

* cited by examiner

*Primary Examiner* — Lex H Malsawma
(74) *Attorney, Agent, or Firm* — William Park & Associates Ltd.

(57) ABSTRACT

A semiconductor device includes a first channel layer and a second channel layer, each extending from an upper portion to a lower portion; and word lines stacked toward the upper portion from the lower portion, the word lines spaced apart from each other, the word lines each extending to surround the first channel layer and the second layer; a first lower select group surrounding a portion of the first channel layer that further protrudes toward the lower portion than the word lines; and a second lower select group surrounding a portion of the second channel layer that further protrudes toward the lower portion than the word lines.

20 Claims, 16 Drawing Sheets

THREE-DIMENSIONAL SEMICONDUCTOR DEVICE

CROSS-REFERENCE TO RELATED APPLICATION

The present application claims priority under 35 U.S.C. § 119(a) to Korean patent application numbers 10-2017-0092484 filed on Jul. 21, 2017 and 10-2018-0015195 filed on Feb. 7, 2018, in the Korean Intellectual Property Office, the entire disclosure of which is incorporated herein by reference.

BACKGROUND

1. Technical Field

An aspect of the present disclosure relates to a semiconductor device and a manufacturing method thereof, and more particularly, to a three-dimensional semiconductor device and a manufacturing method thereof.

2. Related Art

A semiconductor device includes memory cell transistors capable of storing data. A three-dimensional semiconductor device may include memory cell transistors arranged in first to third directions that are different from one another. The three-dimensional semiconductor device includes lines such as select lines and word lines to access the memory cell transistors.

SUMMARY

According to an aspect of the present disclosure, there is provided a semiconductor device including: first channel layers and second channel layers, connected between a source region and bit lines; word lines stacked and spaced apart from each other between the source region and the bit lines, the word lines each extending to surround the first and second channel layers; a first source select line surrounding the first channel layers between the word lines and the source region; a second source select line surrounding the second channel layers between the word lines and the source region, the second source select line disposed to be spaced apart from the first source select line; and a drain select line disposed between the bit lines and the word lines, the drain select line extending to overlap the first and second source select lines.

According to an aspect of the present disclosure, there is provided a semiconductor device including: a first channel layer and a second channel layer, each extending from an upper portion to a lower portion, the first channel layer and the second channel layer, each having a longitudinal sectional structure of which width becomes narrower as the structure comes closer to the lower portion; word lines stacked toward the upper portion from the lower portion, the word lines spaced apart from each other, the word lines each extending to surround the first channel layer and the second layer; a first lower select group surrounding a portion of the first channel layer that further protrudes toward the lower portion than the word lines; and a second lower select group surrounding a portion of the second channel layer that further protrudes toward the lower portion than the word lines.

According to an aspect of the present disclosure, there is provided a method of manufacturing a semiconductor device, the method including: forming a first stack structure; forming isolation insulating layers that separate the first stack structure into first patterns; forming a second stack structure on the first patterns and the isolation insulating layers; and forming slits that penetrate each of the first patterns through the second stack structure such that the second stack structure is separated into second patterns and each of the first patterns are separated into third patterns, and where each of the isolation insulating layers is disposed between adjacent slits.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
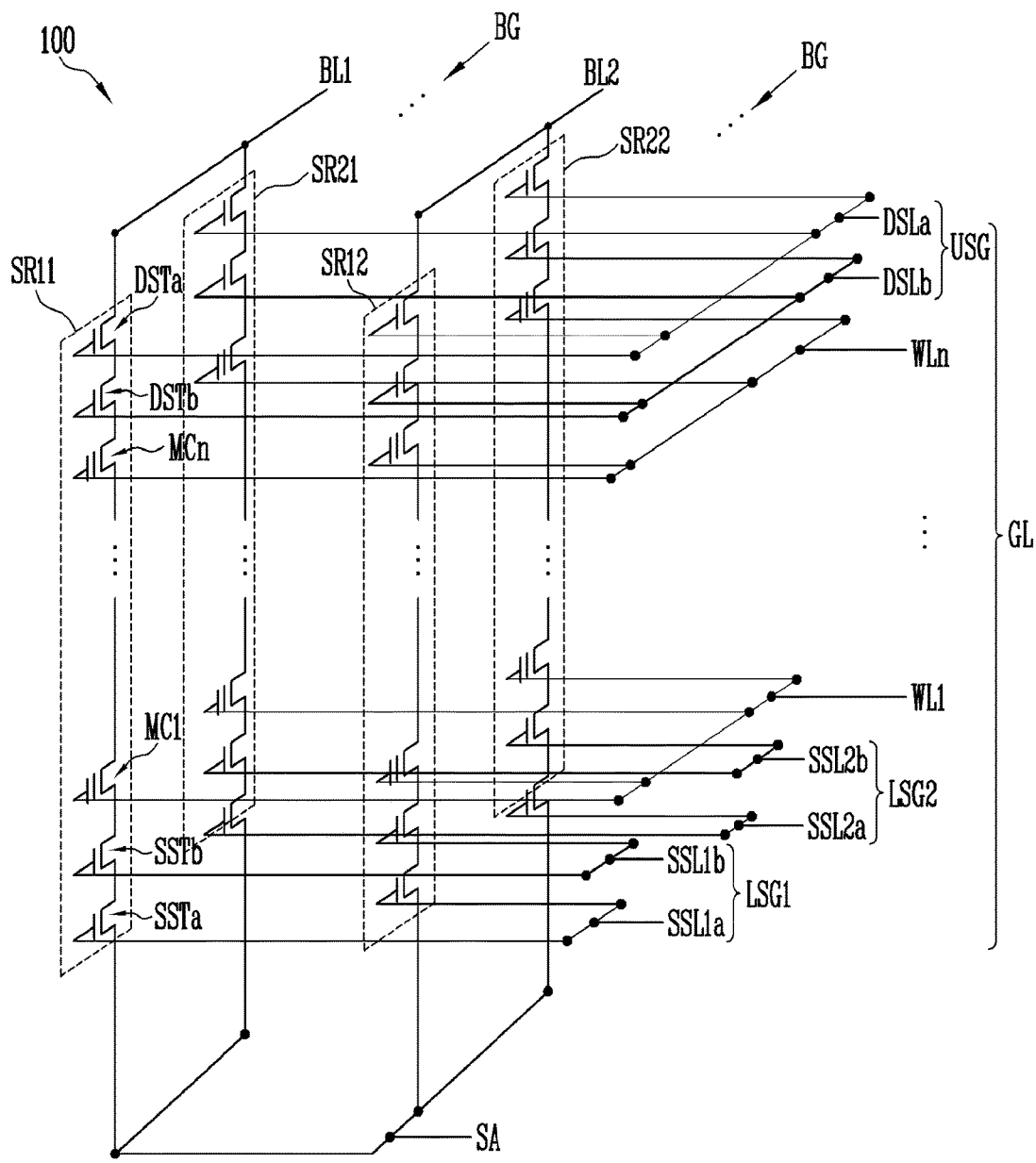
FIG. 1 shows a schematic circuit diagram of a semiconductor device according to an embodiment of the present disclosure.

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

Embodiments provide a semiconductor device and a manufacturing method thereof, which can reduce the area of a cell array region.

FIG. 1 shows a schematic circuit diagram of a semiconductor device according to an embodiment of the present disclosure. FIG. 1 exemplarily illustrates a circuit diagram of a NAND flash memory device.

Referring to FIG. 1, the semiconductor device according to an embodiment includes a memory cell array 100 having a three-dimensional structure, which includes a plurality of memory cells arranged in first to third directions I to III different from one another. The memory cell array 100 includes a plurality of memory strings SR11, SR12, SR21, and SR22. The memory strings SR11, SR12, SR21, and SR22 may be connected between bits lines BL1 and BL2 and a source region SA. Although four memory strings SR11, SR12, SR21, and SR22 connected to a specific gate group GL are illustrated in FIG. 1, the present disclosure is not limited thereto. For example, a plurality of gate groups may be arranged to be spaced apart from each other in the second direction II, and each of the gate groups may control operations of four or more memory strings.

The memory strings SR11, SR12, SR21, and SR22 may be divided into bit groups BG connected to the bit lines BL1 and BL2 different from each other. Memory strings constituting each of the bit groups BG are controlled by the same bit line.

The bit lines BL1 and BL2 may extend in the second direction II, and may be arranged in parallel to each other. The bit lines BL1 and BL2 may include a first bit line BL1 and a second bit line BL2, which are alternately disposed in the third direction III. Although a pair of bit lines BL1 and BL2 is illustrated in FIG. 1, the present disclosure is not limited thereto. For example, a plurality of first bit lines and a plurality of second bit lines may be alternately disposed one by one in the third direction III.

The memory strings SR11, SR12, SR21, and SR22 may be arranged in a zigzag pattern formed so as to improve a degree of integration. For example, the bit group BG connected to the first bit line BL1 and the bit group BG connected to the second bit line BL2 may be arranged in zigzag pattern.

Each of the memory strings SR11, SR12, SR21, and SR22 may include a source select transistor SSTa or SSTb, a plurality of memory cell transistors MC1 to MCn (n is a natural number of 2 or more), and a drain select transistor DSTa or DSTb, which are connected in series. Each of the memory strings SR11, SR12, SR21, and SR22 may include one source select transistor SSTa or two or more source select transistors SSTa and SSTb connected in series. Each of the memory strings SR11, SR12, SR21, and SR22 may include one drain select transistor DSTa or two or more drain select transistors DSTa and DSTb connected in series. Although a case where each of the memory strings SR11, SR12, SR21, and SR22 includes two source select transistors SSTa and SSTb and two drain select transistors DSTa and DSTb is illustrated in FIG. 1, the present disclosure is not limited thereto. Hereinafter, for convenience of description, one of the two source select transistors is referred to as a lower source select transistor SSTa, and the other of the two source select transistors, which is adjacent to the lower source select transistor SSTa in the first direction I, is referred to as an upper source select transistor SSTb. Similarly, one of the two drain select transistors is referred to as a lower drain select transistor DSTb, and the other of the two drain select transistors, which is adjacent to the lower drain select transistor DSTb in the first direction I, is referred to as an upper drain select transistor DSTa.

The lower and upper source select transistors SSTa and SSTb, the plurality of memory cell transistors MC1 to MCn, and the lower and upper drain select transistors DSTb and DSTa may be connected in series by a channel layer extending in the first direction I to form one memory string SR11, SR12, SR21, or SR22. One channel layer may be connected to one of the first and second bit lines BL1 and BL2, which each corresponds to a channel layer, and the source region SA.

The memory strings SR11, SR12, SR21, and SR22 may be connected to a gate group GL. The gate group GL may include an upper select group USG, word lines WL1 to WLn, a first lower select group LSG1, and a second lower select group LSG2. Each of the word lines WL1 to WLn may extend in a horizontal direction. The horizontal direction is parallel to the second direction II and the third direction III, and vertically intersects the first direction I. The word lines WL1 to WLn are connected to gates of the memory cell transistors MC1 to MCn, respectively.

FIG. 1 illustrates memory strings SR11, SR12, SR21, and SR22 of first to fourth rows, which are commonly connected to the word lines WL1 to WLn. Although FIG. 1 illustrates only one memory string constituting each row, each row includes a plurality of memory strings. The memory strings constituting each row are connected to first bit lines and second bit lines, which are alternately disposed in the third direction III, and are arranged in a line in the third direction III. The memory strings SR11, SR12, SR21, and SR22 of the first to fourth rows may be arranged in a zigzag pattern. The memory strings SR11 and SR21 of the first and third rows are connected to the first bit line BL1, and the memory strings SR12 and SR22 of the second and fourth rows are connected to the second bit line BL2.

The memory strings SR11, SR12, SR21, and SR22 of the first to fourth rows may be commonly connected to the upper select group USG extending in the horizontal direction. The upper select group USG may include one or more drain select lines DSLa and DSLb. For example, the upper select group USG may include an upper drain select line DSLa and a lower drain select line DSLb. The upper drain select line DSLa and the lower drain select line DSLb may extend in parallel to each other. The upper drain select line DSLa is connected to a gate of the upper drain select transistor DSTa included in each of the memory strings SR11, SR12, SR21, and SR22 of the first to fourth rows. The lower drain select line DSLb is connected to a gate of the lower drain select transistor DSTb included in each of the memory strings SR11, SR12, SR21, and SR22 of the first to fourth rows.

The first lower select group LSG1 and the second lower select group LSG2 may be electrically and structurally isolated from each other, and may be disposed in the same layer. The memory strings SR11, SR12, SR21, and SR22 of the first to fourth rows may be connected to the first lower select group LSG1 or may be connected to the second lower select group LSG2. More specifically, the memory strings SR11 and SR12 of the first and second rows may be connected to the first lower select group LSG1, and the memory strings SR21 and SR22 of the third and fourth rows may be connected to the second lower select group LSG2.

The first lower select group LSG1 may include one or more source select lines SSL1a and SSL1b. For example, the first lower select group LSG1 may include a first lower source select line SSL1a and a first upper source select line SSL1b. Similarly, the second lower select group LSG2 may include one or more source select lines SSL2a and SSL2b. For example, the second lower select group LSG2 may include a second lower source select line SSL2a and a second upper source select line SSL2b. Further, the source select lines SSL1a, SSL1b, SSL2a and SSL2b may be formed narrower than each of the word lines WL1 to WLn and drain select lines DSLa and DSLb.

The first lower source select line SSL1a is connected to a gate of the lower source select transistor SSTa included in each of the memory strings SR11 and SR12 of the first and second rows. The first upper source select line SSL1b is connected to a gate of the upper source select transistor SSTb included in each of the memory strings SR11 and SR12 of the first and second rows. The second lower source select line SSL2a is connected to a gate of the lower source select transistor SSTa included in each of the memory strings SR21 and SR22 of the third and fourth rows. The second upper source select line SSL2b is connected to a gate of the upper source select transistor SSTb included in each of the memory strings SR21 and SR22 of the third and fourth rows.

According to the above-described circuit, the upper select group USG may control an electrical connection between the memory strings SR11, SR12, SR21, and SR22 of the first to fourth rows and the first and second bit lines BL1 and BL2. The first lower select group LSG1 may control an electrical connection between the memory strings SR11 and SR12 of the first and second rows and the source region SA. The second lower select group LSG2 may control an electrical connection between the memory strings SR21 and SR22 of the third and fourth rows and the source region SA. Accordingly, the memory strings SR11, SR12, SR21, and SR22 of the first to fourth rows can be individually controlled. For example, if one upper select group is selected, one bit line is selected, and any one of first and second lower select groups is selected, one of the memory strings SR11, SR12, SR21, and SR22 of the first to fourth rows may be selected.

The above-described gate group GL may be disposed between adjacent slits, and two gate groups may constitute one memory block. Hereinafter, a structure of a memory block including two gate groups will be described with reference to FIG. 2.

Figure 2:
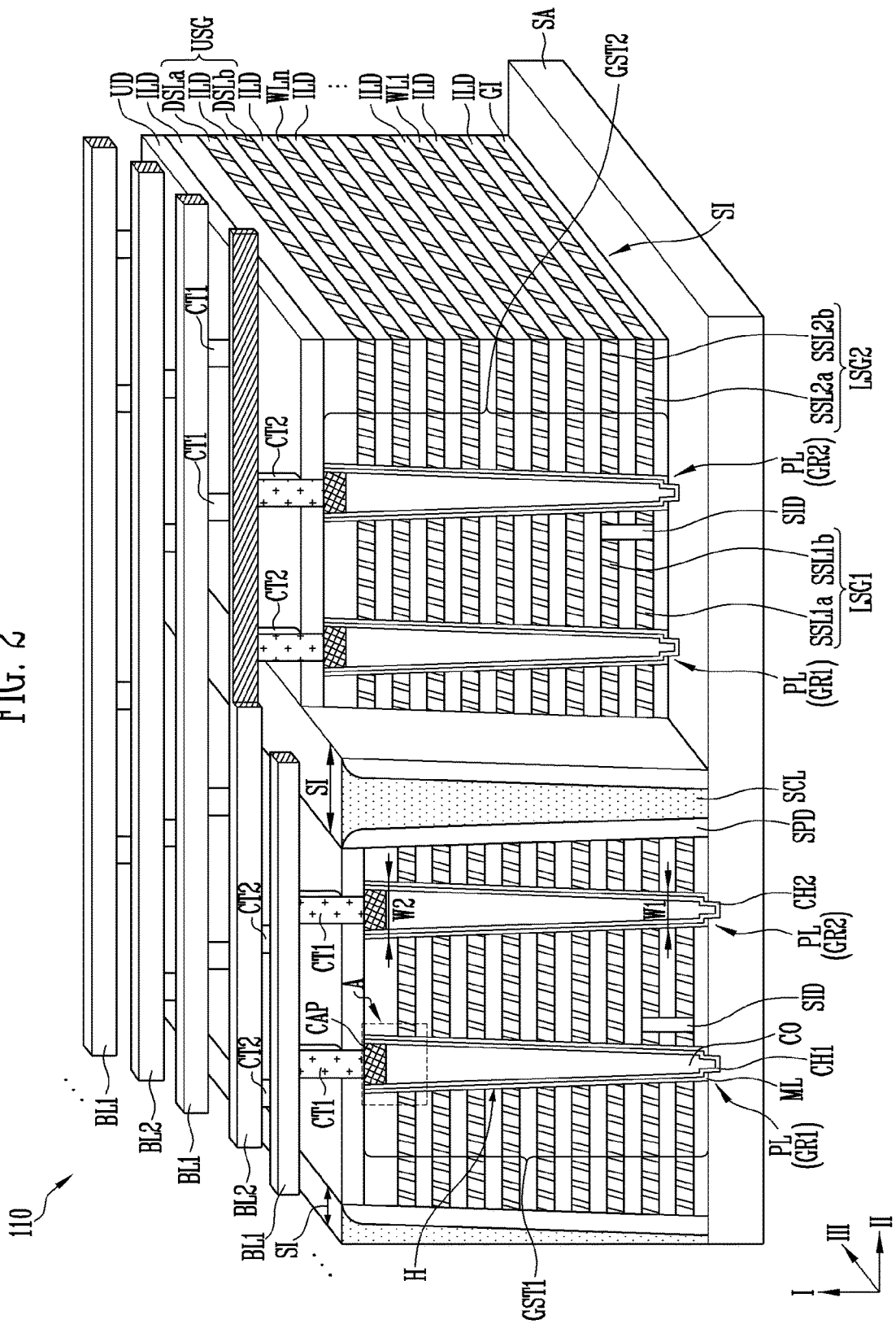
FIG. 2 shows a perspective view illustrating a semiconductor device according to an embodiment of the present disclosure.

FIG. 2 shows a perspective view illustrating a semiconductor device according to an embodiment of the present disclosure. FIG. 2 shows a perspective view illustrating a structure of a semiconductor device 110 configured with the circuit shown in FIG. 1.

Referring to FIG. 2, the memory strings SR11, SR12, SR21, and SR22 of the first to fourth rows, shown in FIG. 1, may be configured through a first gate stack structure GST1 and channel layers CH1 and CH2, or may be configured through a second gate stack structure GST2 and channel layers CH1 and CH2. The first gate stack structure GST1 and the second gate stack structure GST2 may be separated from each other by one among slits SI. Although a memory block including a pair of first and second stack structures GST1 and GST2 is illustrated in FIG. 2, a plurality of memory blocks may be arranged in a second direction II. Some of the slits SI may be disposed to isolate gate stack structures adjacent to a boundary between memory blocks.

The first and second gate stack structures GST1 and GST2 are disposed between a source region SA and first and second bit lines BL1 and BL2. The source region SA may extend in the second direction II and a third direction III. The source region SA may be formed of at least one doped silicon layer including a first conductivity type impurity. The first conductivity type impurity may be an n-type impurity. The slits SI may extend up to the source region SA. The source region SA is connected to source contact lines SCL. The source contact lines SCL are disposed in the slits SI, respectively.

Each of the first and second gate stack structures GST1 and GST2 is disposed between adjacent source contact lines SCL. Each of the first and second gate stack structures GST1 and GST2 may be penetrated by cell plugs PL. Each of the cell plugs PL may include a channel layer CH1 or CH2, a multi-layered memory pattern ML, and a capping pattern CAP. The cell plugs PL may be divided into a first group GR1 and a second group GR2. The first group GR1 includes cell plugs PL surrounded by a first lower select group LSG1. The second group GR2 includes cell plugs PL surrounded by a second lower select group LSG2.

The channel layers CH1 and CH2 may be divided into first channel layers CH1 constituting the first group GR1 and second channel layers CH2 constituting the second group GR2. Each of the first and second channel layers CH1 and CH2 is in contact with the source region SA by penetrating the first gate stack structure GST or the second gate stack structure GST2. Each of the first and second channel layers CH1 and CH2 may be formed of a semiconductor layer. For example, each of the first and second channel layers CH1 and CH2 may be formed of a silicon layer.

Each of the first and second channel layers CH1 and CH2 is disposed in a hole H that penetrates the first gate stack structure GST1 or the second gate stack structure GST2. Each of the first and second channel layers CH1 and CH2 may be a thin film deposited along the surface of the hole H to surround a core insulating layer CO. The core insulating layer CO may be formed with a height lower than each of the first and second channel layers CH1 and CH2. In this case, each of the cell plugs PL may further include the capping pattern CAP. The capping pattern CAP may be formed on the core insulating layer CO to fill in an upper central portion of the hole H, which is defined by an upper end of each of the first and second channel layers CH1 and CH2. The capping pattern CAP may be in direct contact with one of the first and second channel layers CH1 and CH2, which correspond with the capping pattern CAP. The capping pattern CAP may be formed of a semiconductor layer doped with a first conductivity type impurity. The first conductivity type impurity may be an n-type impurity. More specifically, the capping pattern CAP may be a doped silicon layer doped with an n-type impurity. The capping pattern CAP may be used as a drain junction.

Although not shown in the drawing, the capping pattern CAP and the core insulating layer CO may be omitted. In this case, each of the first and second channel layers CH1 and CH2 may be formed to completely fill in a central region of the hole H defined by the multi-layered memory pattern ML.

The multi-layered memory pattern ML surrounds a sidewall of each of the first and second channel layers CH1 and CH2. The multi-layered memory pattern ML may extend along an interface between any one of the first and second channel layers CH1 and CH2, which corresponds thereto, and the first or second gate stack structure GST1 or GST2. Each of the first and second channel layers CH1 and CH2 may protrude farther toward the source region SA than the multi-layered memory pattern ML to be in direct contact with the source region SA.

A portion of each multi-layered memory pattern ML disposed between an upper select group USG and the first and second channel layers CH1 and CH2, a portion of each multi-layered memory pattern ML disposed between the first lower select group LSG1 and the first channel layers CH1, and a portion of each multi-layered memory pattern ML disposed between the second lower select group LSG1 and the second channel layers CH2 may be used as a gate insulating layer.

Each of the first and second channel layers CH1 and CH2 has a longitudinal sectional structure having a width which narrows in a second direction II as the the longitudinal sectional structure comes closer to a lower portion adjacent to the source region SA, where the narrowing occurs due to characteristics of a manufacturing process of the semiconductor device 110. In other words, a lower end width W1 of each of the first and second channel layers CH1 and CH2 is formed narrower than an upper end width W2. Therefore, the distance between adjacent first and second channel layers CH1 and CH2 increases as the first and second channel layers CH1 and CH2 approach the source region SA. The longitudinal sectional structure may have a shape of an inverse trapezoid.

Each of the first and second gate stack structures GST1 and GST2 include word lines WL1 to WLn stacked to be spaced apart from each other in a first direction I. Each of the word lines WL1 to WLn may extend in a horizontal direction in the second and third directions II and III to commonly surround the first and second channel layers CH1 and CH2. The first and second channel layers CH1 and CH2 protrude past the word lines WL1 to WLn toward a lower portion at which the source region SA is disposed. The first and second channel layers CH1 and CH2 may protrude past the word lines WL1 to WLn toward an upper portion at which the first and second lines BL1 and BL2 are disposed.

Each of the first and second gate stack structures GST1 and GST2 includes an upper select group USG disposed between the word lines WL1 to WLn and the first and second bit lines BL1 and BL2. The upper select group USG may extend in the horizontal direction in the second and third directions II and III to commonly surround portions of the first and second channel layers CH1 and CH2 that protrude farther than the word lines WL1 to WLn.

Each of the first and second gate stack structures GST1 and GST2 includes a first lower select group LSG1 and a second lower select group LSG2, which are disposed between the word lines WL1 to WLn and the source region SA. The first lower select group LSG1 and the second lower select group LSG2 are disposed in a same layer. More specifically, a first lower source select line SSL1$a$ of the first lower select group LSG1 and a second lower source select line SSL2$a$ of the second lower select group LSG2 are disposed in the same layer, and a first upper source select line SSL1$b$ of the first lower select group LSG1 and a second upper source select line SSL2$b$ of the second lower select group LSG2 are disposed in a same layer. The first lower select group LSG1 surrounds portions of the first channel layers CH1 protruding past the word lines WL1 to WLn toward the lower portion at which the source region SA is disposed, and the second lower select group LSG2 surrounds portions of the second channel layers CH2 protruding past the word lines WL1 to WLn toward the lower portion at which the source region SA are disposed. Further, in an embodiment, the second lower select group LSG2 does not surround the first channel layers CH1 and the first lower select group LSG1 does not surround the second channel layers CH2.

An upper drain select line DSLa and a lower drain select line DSLb of the upper select group USG extend to overlap the first and second lower select groups LSG1 and LSG2. The word lines WL1 to WLn extend to overlap the first and second lower select groups LSG1 and LSG2.

Each of the first and second gate stack structures GST1 and GST2 may further include a gate insulating layer GI disposed between the first and second lower select groups LSG1 and LSG2 and the source region SA. Each of the first and second gate stack structures GST1 and GST2 may further include interlayer insulating layers ILD disposed between the upper drain select line DSLa and the lower drain select line DSLb, the word lines WL1 to WLn, and the upper source select lines SSL1$b$ and SSL2$b$ and the lower source select lines SSL1$a$ and SSL1$b$.

The gate insulating layer GI and the interlayer insulating layers ILD may extend in the horizontal direction. The gate insulating layer GI and the interlayer insulating layers ILD may be formed of an oxide layer.

Each of the first and second gate stack structures GST1 and GST2 may further include an isolation insulating layer SID that is disposed between the first lower select group LSG1 and the second lower select group LSG2. The first lower select group LSG1 and the second lower select group LSG2 may be separated from each other by the isolation insulating layer SID. The isolation insulating layer SID may penetrate the interlayer insulating layer ILD between the upper source select lines SSL1$b$ and SSL2$b$ and the lower source select lines SSL1$a$ and SSL2$a$. The isolation insulating layer SID may be covered by the word lines WL1 to WLn and the upper select group USG.

The isolation insulating layer SID does not penetrate the word lines WL1 to WLn or the upper select group USG between adjacent slits SI, but the isolation insulating layer SID extends between the first lower select group LSG1 and the second lower select group LSG2 between adjacent slits SI. Accordingly, the width of each of the first lower select group LSG1 and the second lower select group LSG2 is formed narrower than that of each of the word lines WL1 to WLn and the upper select group USG.

As described above, the first and second channel layers CH1 and CH2 have an inverse trapezoidal shape due to characteristics of the manufacturing process of the semiconductor device 110. Accordingly, the distance between the first and second channel layers CH1 and CH2 adjacent to each other becomes narrower as the first and second channel layers CH1 and CH2 extend toward the upper insulating layer UD. On the other hand, the distance between the first and second channel layers CH1 and CH2 becomes wider as the first and second channel layers CH1 and CH2 extend toward the source region SA.

According to an embodiment, a space between upper ends of the first and second channel layers CH1 and CH2 is not separated into two spaces by the isolation insulating layer SID, and is filled with the upper select group USG. In other words, the upper select group USG which resides between the slits SI is not separated, and is formed in a shape extending to commonly surround the first and second channel layers CH1 and CH2. Thus, in the present disclosure, it is unnecessary to widen a distance between the first and second channel layers CH1 and CH2 so as to secure a space for separating the upper select group USG into two groups between the slits SI. As a result, in the present disclosure, the degree of integration of the semiconductor device 110 can be improved.

Because a lower end space between lower ends of the first and second channel layers CH1 and CH2 is relatively wide, the lower end space has an area in which the isolation insulating layer SID can be disposed. According to an embodiment, the lower end space has an area in which the isolation insulating layer SID is disposed without expanding a separate horizontal space. Accordingly, in the present disclosure, a degree of integration of the semiconductor device 110 can be improved. The isolation insulating layer SID electrically isolates the first lower select group LSG1 surrounding the first channel layers CH1 and the second lower select group LSG2 surrounding the second channel layers CH2 from each other. Accordingly, in the present disclosure, an operation such as a program operation can be performed by selecting any one memory string among the memory strings, which is defined by the first or second gate stack structures GST1 and GST2 and the first and second channel layers CH1 and CH2.

The first channel layers CH1 and the second channel layers CH2 may be structurally in contact with the source region SA. According to an embodiment of the present disclosure, the first and second channel layers CH1 and CH2 of the memory block can be electrically connected, in units of divided groups, to the source region SA by controlling a signal applied to the first lower select group LSG1 and the second lower select group LSG2, which are electrically isolated from each other. Accordingly, in the present disclosure, the operational reliability of the semiconductor device 110 can be improved by preventing a disturbance.

Because the word lines WL1 to WLn and the upper select group USG surround the same first and second channel layers CH1 and CH2, the total number of first and second channel layers CH1 and CH2 surrounded by each of the word lines WL1 to WLn is equal to that of first and second channel layers CH1 and CH2 surrounded by the upper select group USG. The total number of first channel layers CH1 surrounded by the first lower select group LSG1 may be equal to that of second channel layers CH2 surrounded by the second lower select group LSG2. Accordingly, the total number of first and second channel layers CH1 and CH2 surrounded by each of the word lines WL1 to WLn may be two times the number of first channel layers CH1 surrounded by the first lower select group LSG1, or may be two times the number of second channel layers CH2 surrounded by the second lower select group LSG2.

Each of the first and second bit lines BL1 and BL2 is commonly connected to at least one of the first channel layers CH1 and at least one of the second channel layers CH2.

A gate group including the word lines WL1 to WLn, the drain select lines DSLa and DSLb, and the source select lines SSL1a, SSL2a, SSL1b, and SSL2b may be formed of at least one of doped silicon, silicide, and metal. In order to achieve low-resistance wiring, the gate group may include a metal having a low resistance, such as tungsten. Although not shown in the drawing, a barrier layer that prevents direct contact between the multi-layered memory pattern ML and each of the word lines WL1 to WLn, the drain select lines DSLa and DSLb, and the source select lines SSL1a, SSL2a, SSL1b, and SSL2b may be further formed at an interface between the multi-layered memory pattern ML and each of the word lines WL1 to WLn, the drain select lines DSLa and DSLb, and the source select lines SSL1a, SSL2a, SSL1b, and SSL2b. The barrier layer may include a titanium nitride layer, a tungsten nitride layer, a tantalum nitride layer, and the like.

Spacer insulating layers SPD may be disposed between the first and second gate stack structures GST1 and GST2 and the source contact lines SCL such that the first and second gate stack structures GST1 and GST2 can be electrically insulated from the source contact lines SCL. The slits SI, the spacer insulating layers SPD, and the source contact lines SCL may extend in the third direction III.

The source contact lines SCL may be formed of a conductive material, to transmit a common source voltage applied from a peripheral circuit (not shown) to the source region SA.

The first and second gate stack structures GST1 and GST2 may be covered by an upper insulating layer UD. The slits SI, the spacer insulating layers SPD, and the source contact lines SCL may further penetrate the upper insulating layer UD.

The first and second channel layers CH1 and CH2 may be electrically connected to the first and second bit lines BL1 and BL2 via first and second contact plugs CT1 and CT2. The first and second contact plugs CT1 and CT2 may be divided into first contact plugs CT1 connected to the first bit lines BL1 and second contact plugs CT2 connected to the second bit lines BL2. The first and second contact plugs CT1 and CT2 may be in contact with the capping pattern CAP by penetrating the upper insulating layer UD. The capping pattern CAP may reduce contact resistance between the first and second contact plugs CT1 and CT2 and the first and second channel layers CH1 and CH2.

Figure 3A:
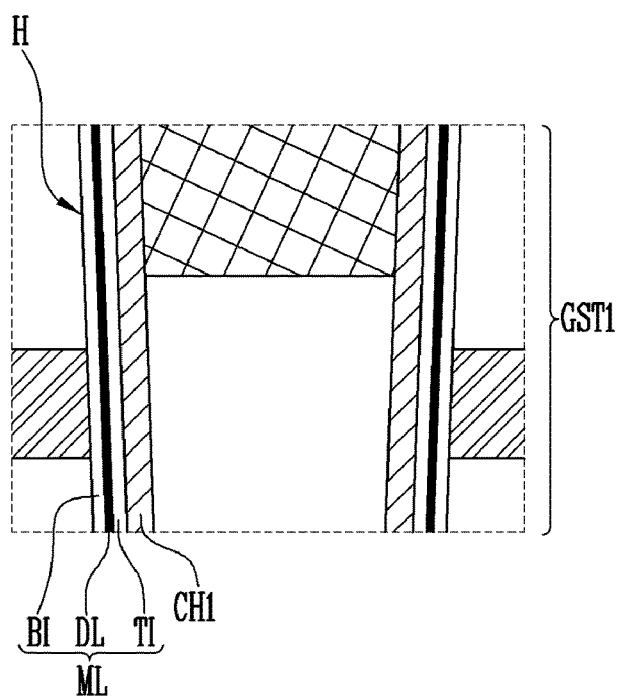
FIGS. 3A to 3C show sectional views illustrating various structures of a multi-layered memory pattern.
Figure 3B:
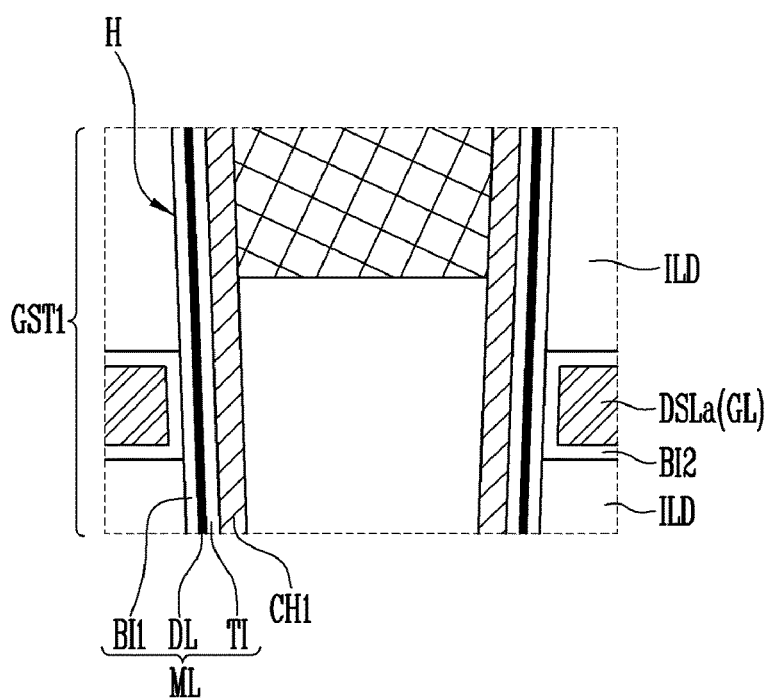
Figure 3C:
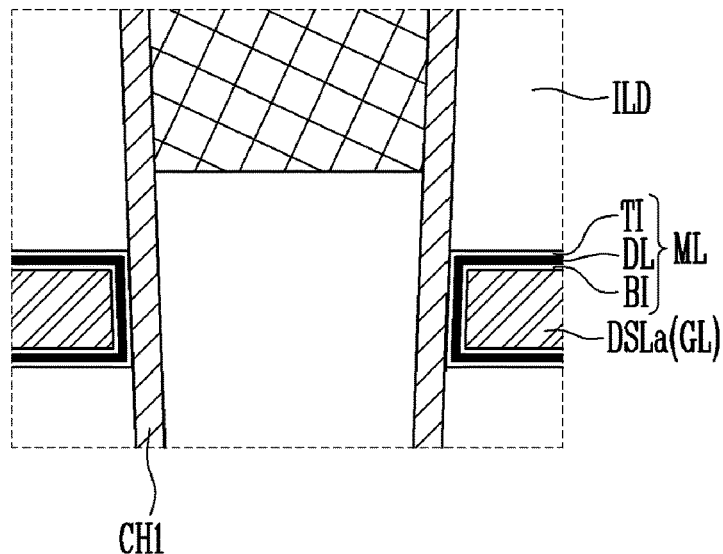

FIGS. 3A to 3C show sectional views illustrating various structures of a multi-layered memory pattern. FIG. 3A shows an enlarged sectional view of region A shown in FIG. 2, and FIGS. 3B and 3C illustrates modifications of the embodiment shown in FIG. 3A.

Referring to FIGS. 3A to 3C, the multi-layered memory pattern ML may include a tunnel insulating layer TI surrounding the channel layer CH1, a data storage layer DL surrounding the tunnel insulating layer TI, and a blocking insulating layer BI or BI1 surrounding the data storage layer DL. The data storage layer DL may store data changed using Fowler-Nordheim tunneling caused by a difference in voltage between the word lines (WL1 to WLn of FIG. 2) and the channel layer CH1. To this end, the data storage layer DL may be formed of various materials. For example, the data storage layer DL may be formed of a nitride layer in which charges can be trapped. In addition, the data storage layer DL may include silicon, a phase change material, nanodots, and the like. The blocking insulating layer BI or BI1 may include an oxide layer capable of blocking charges. The tunnel insulating layer TI may be formed of a silicon oxide layer in which charge tunneling is available.

Referring to FIGS. 3A and 3B, the multi-layered memory pattern ML may extend along the surface of the hole H that penetrates the gate stack structure GST1.

Referring to FIG. 3B, the semiconductor device may include a second blocking insulating layer BI2. The second blocking insulating layer BI2 may be formed of a material different from that of the blocking insulating layer BI or BI1 included in the multi-layered memory pattern ML. The second blocking layer BI2 may be formed of an insulating material having a dielectric constant higher than that of the blocking insulating layer BI or BI1. For example, the blocking insulating layer BI or BI1 may be formed of a silicon oxide layer, and the second blocking insulating layer BI2 may be formed of a metal oxide layer. $Al_2O_3$ may be used as metal oxide for the second blocking insulating layer bI2. The second blocking insulating layer BI2 may extend along interfaces between the interlayer insulating layers ILD and a conductive pattern (e.g., DSLa) of the gate group GL and an interface between the conductive pattern (e.g., DSLa) of the gate group GL and the multi-layered memory pattern ML.

Referring to FIG. 3C, the multi-layered memory pattern ML may extend along an interface between the channel layer CH1 and the conductive pattern (e.g., DSLa) of the gate group GL and interfaces between the interlayer insulating layers ILD and the conductive pattern (e.g., DSLa) of the gate group GL.

Figure 4:
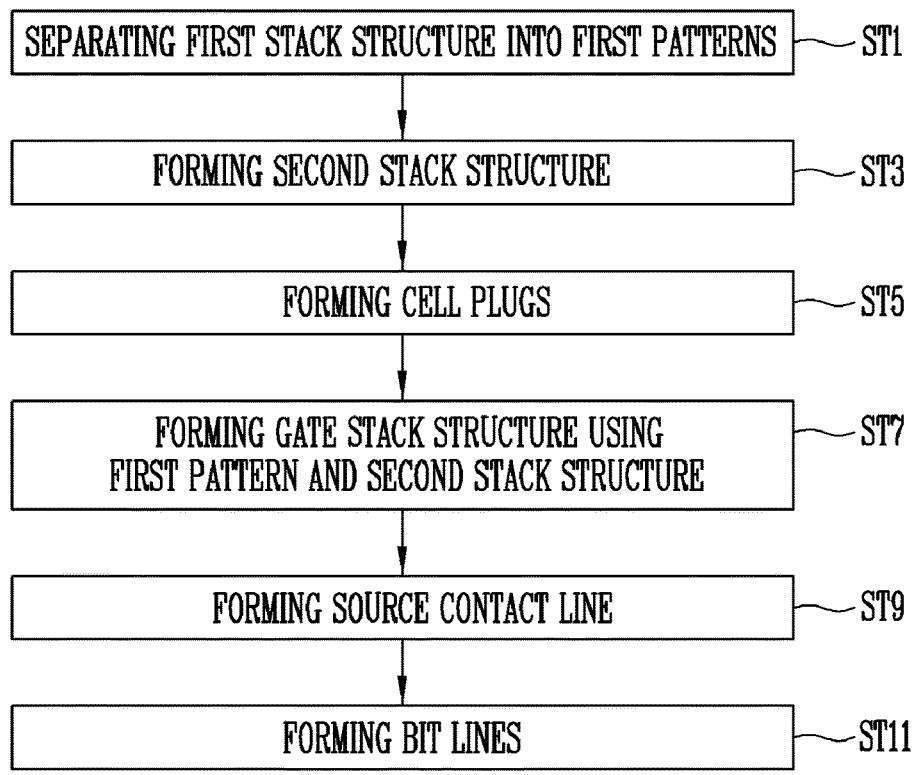
FIG. 4 shows a flowchart schematically illustrating a manufacturing method of the semiconductor device according to an embodiment of the present disclosure.

FIG. 4 shows a flowchart schematically illustrating a manufacturing method of the semiconductor device according to an embodiment of the present disclosure. FIGS. 5A to 11 show views sequentially illustrating a step by step manufacturing method of the semiconductor device according to an embodiment of the present disclosure.

Referring to FIG. 4, the semiconductor device may be formed by sequentially performing steps ST1 to ST11. The steps ST1 to ST11 may be performed on a substrate including a driving circuit for driving the semiconductor device. Hereinafter, a manufacturing method of the semiconductor device according to an embodiment of the present disclosure will be described in more detail with reference to FIGS. 5A to 11.

Figure 5A:
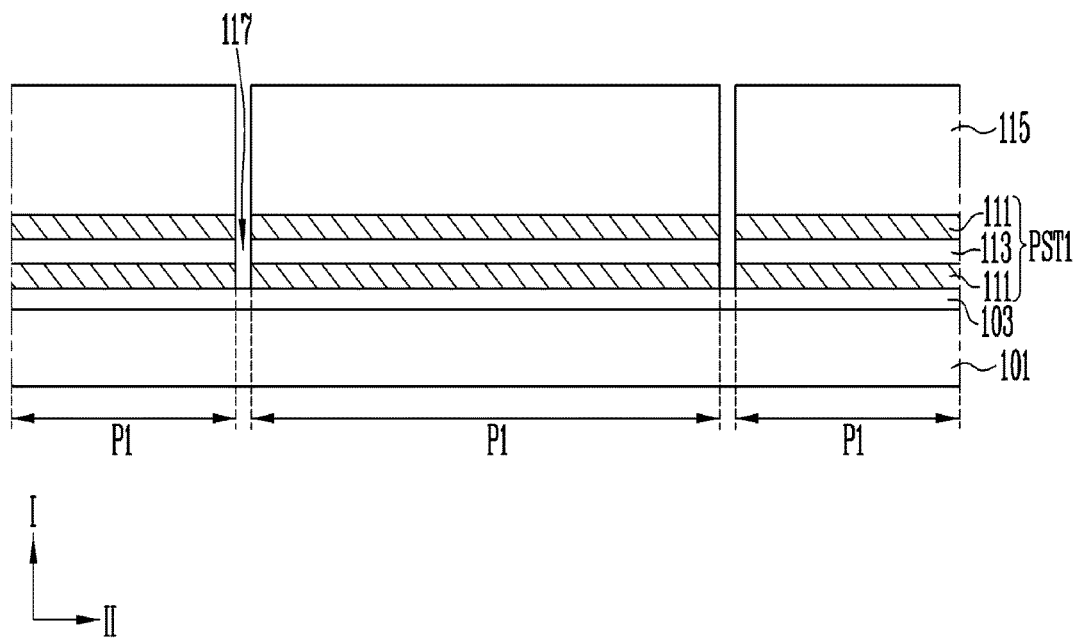
FIGS. 5A to 11 show views sequentially illustrating a step by step manufacturing method of the semiconductor device according to an embodiment of the present disclosure.
Figure 5B:
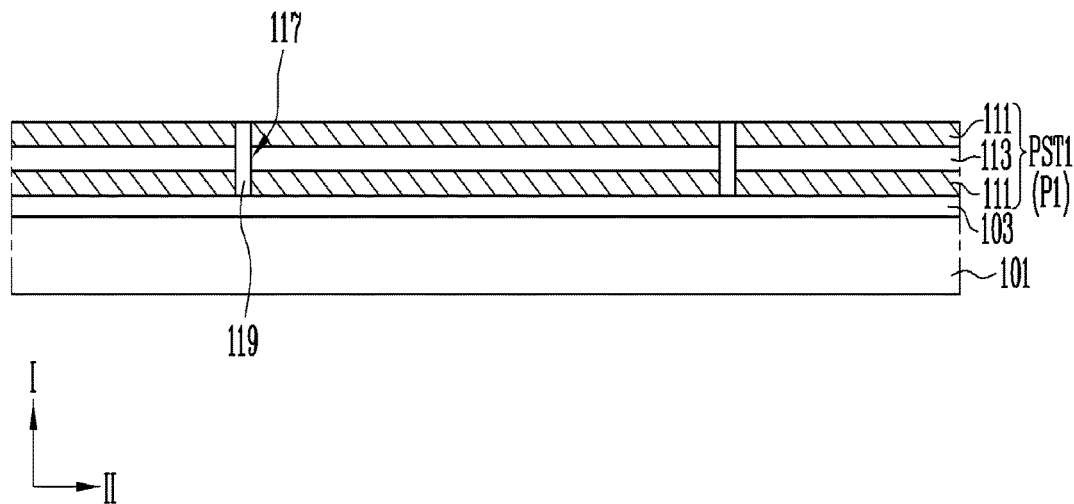

Referring to FIG. 4, a step ST1 of separating a first stack structure into first patterns may be performed after a source region and a gate insulating layer are sequentially formed on a substrate having a driving circuit formed on the substrate. FIGS. 5A and 5B show sectional views illustrating the step ST1 shown in FIG. 4.

Referring to FIG. 5A, a source region 101 may be a doped silicon layer including a first conductivity type impurity. The first conductivity type impurity may be an n-type impurity. The source region 101 may be formed on a well structure (not shown) including a second conductivity type impurity different from the first conductivity impurity. Although not shown in the drawing, the well structure may be formed on a substrate (not shown). Transistors constituting a driving circuit, an insulating layer covering the driving circuit, contact plugs connected to the driving circuit, and routing lines may be arranged between the substrate and the well structure. In the above, the second conductivity impurity may be a P-type impurity.

A gate insulating layer 103 may be disposed on the source region 101, and may be formed of a silicon oxide layer.

A first stack structure PST1 is formed on the gate insulating layer 103. The first stack structure PST1 may include at least one first material layer 111 and at least one second material layer 113. The first material layers 111 and the second material layers 113 are alternately stacked. When each of the first and second lower select groups is to be formed in a structure including upper and lower source select lines as illustrated in FIG. 2, the first stack structure PST1 may include two first material layers 111 and a second material layer 113 disposed between the first material layers 111. The structure of the first stack structure of the present disclosure is not limited thereto, and the first stack structure PST1 may include a plurality of first material layers 111 and a plurality of second material layers 113, which are alternately stacked one by one.

The first material layer 111 and the second material layer 113 are formed of different materials. In a first case, the first material layer 111 may be formed of an insulating material for sacrificial layers, and the second material layer 113 may be formed of an insulating material for interlayer insulating layers. More specifically, the first material layers 111 may be formed of a silicon nitride layer, and the second material layers 113 may be formed of a silicon oxide layer. In a second case, the first material layer 111 may be formed of a conductive material for gate groups, and the second material layer 113 may be formed of an insulating material for interlayer insulating layers. More specifically, the first material layer may include at least one of a doped silicon layer, a metal silicide layer, and a metal layer, and the second material layer 113 may be formed of a silicon oxide layer. In a third case, the first material layer 111 may be formed of a conductive material for gate groups, and the second material layer 113 may be formed of a conductive material for sacrificial layers. More specifically, the first material layer 111 may be formed of a doped silicon layer, and the second material layer 113 may be formed of an undoped silicon layer.

The step ST1 may include a step of forming a mask pattern 115 on the first stack structure PST1 and a step of separating the first stack structure PST1 into first patterns P1 through an etching process using the mask pattern 115 as an etching barrier.

The mask pattern 115 may be formed using a photolithography process. The first stack structure PST1 is etched through an etching process using the mask pattern 115 as an etching barrier, so that first slits 117 are formed. The first slits 117 penetrate the first stack structure PST1, and separate the first stack structure PST1 into the first patterns P1.

Referring to FIG. 5B, the step ST1 includes a step of forming isolation insulating layers 119 filled in the first slits 117. The step of forming the isolation insulating layers 119 may include a step of forming an insulating layer such that the first slits 117 are completely filled and a step of defining the isolation insulating layers 119 by planarizing the insulating layer. The mask pattern 115 may be removed in the course of performing a planarization process for forming the isolation insulating layers 119, or may be removed through a separate removal process. Accordingly, the first patterns P1 can be exposed.

Figure 6:
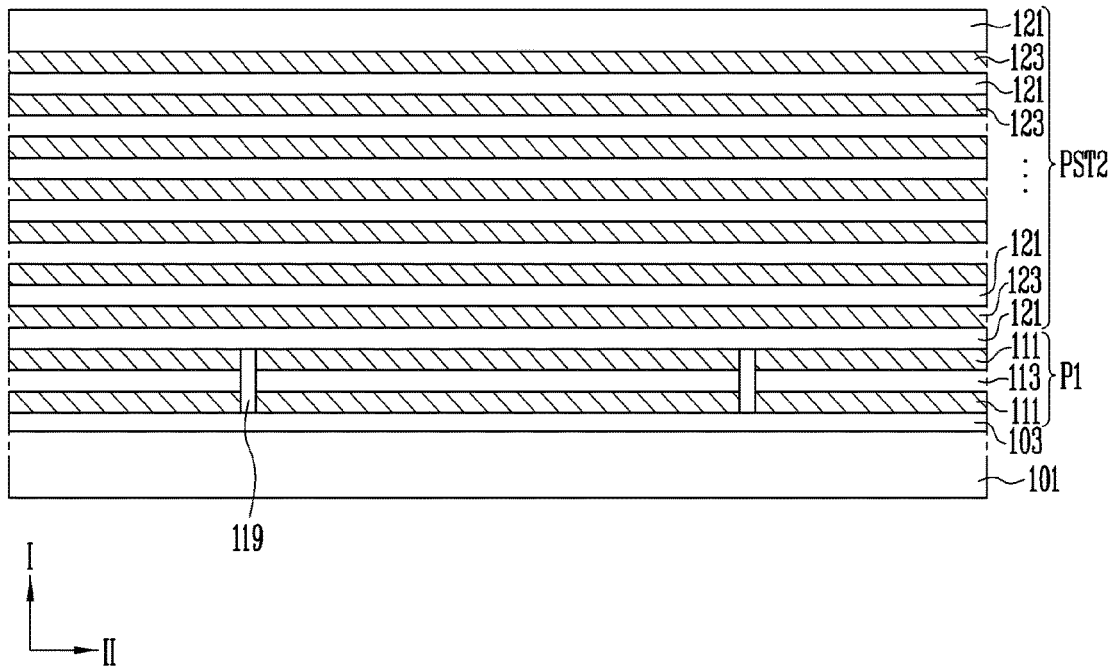

Referring to FIG. 4, after the step ST1, the step ST3 of forming a second stack structure may be performed. FIG. 6 shows a sectional view illustrating the ST3 shown in FIG. 4.

Referring to FIG. 6, a second stack structure PST2 is formed on the first patterns P1 and the isolation insulating layers 119. The second stack structure PST2 extends to cover the first patterns P1 and the isolation insulating layers 119. The second stack structure PST2 may include third material layers 121 and fourth material layers 123, which are alternately stacked one by one. The fourth material layer 123 may be formed of a material different from that of the third material layer 121. The third material layer 121 may be formed of the same material as the second material layer 113, and the fourth material layer 121 may be formed of the same material as the first material layer 111.

Referring to FIG. 4, after the step ST3, the step ST5 of forming cell plugs may be performed. Hereinafter, the step ST5 and the cell plugs formed through the step ST5 will be described in more detail with reference to FIGS. 7, 8A and 8B.

Figure 7:
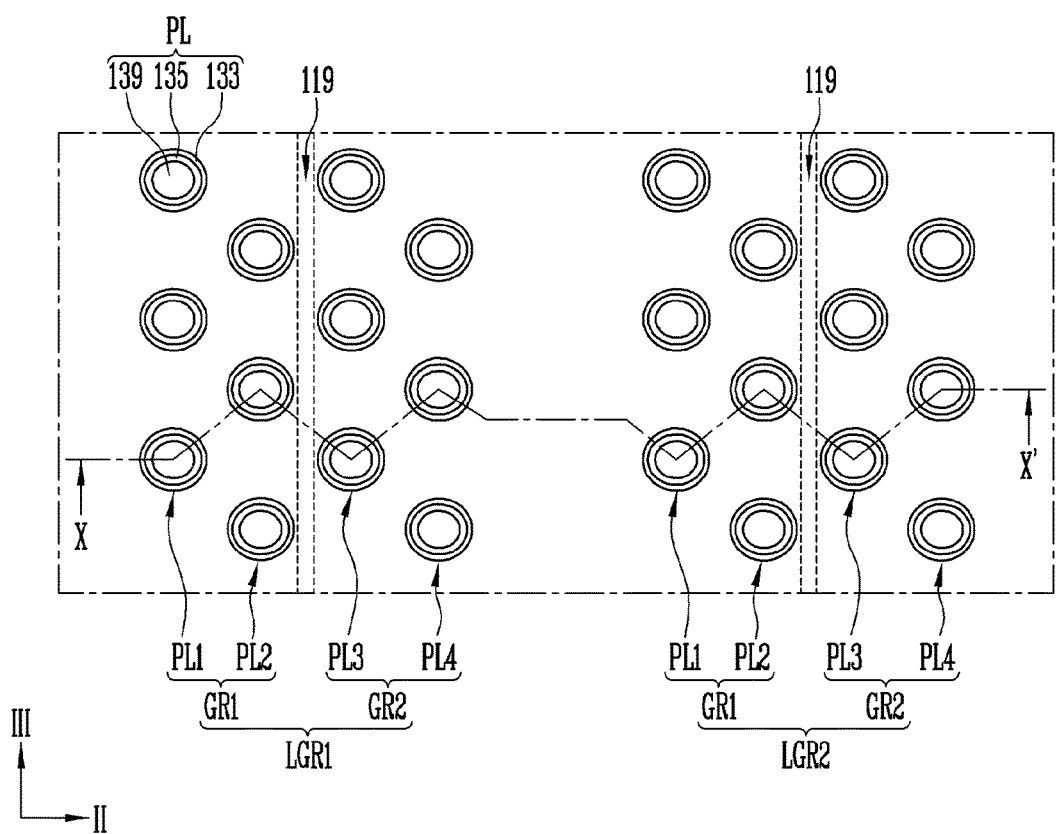

FIG. 7 shows a plan view illustrating an arrangement of the cell plugs formed through the step ST5 shown in FIG. 4.

Referring to FIG. 7, cell plugs PL may be formed through the step ST5. Each of the cell plugs PL may include a multi-layered memory pattern 133, a channel layer 135, and a capping pattern 139. The multi-layered pattern 133 may include a blocking insulating layer, a data storage layer, and a tunnel insulating layer as illustrated in FIG. 3A. The multi-layered memory pattern 133 may be formed to surround a sidewall of the channel layer 135. The capping pattern 139 may be disposed in a central region defined by the channel layer 135.

The cell plugs PL may be divided into a first large group LGR1 and a second large group LGR2, which are alternately disposed in a second direction II. Cell plugs PL of each of the first large group LGR1 and the second large group LGR2 may be divided into a first group GR1 and a second group GR2, which are disposed at both sides of the isolation insulating layer 119 about the isolation insulating layer 119.

Each of the first group GR1 of the first large group LGR1 and the first group GR1 of the second large group LGR2 may include first cell plugs PL1 and second cell plugs PL2. Each of the second group GR2 of the first large group LGR1 and the second group GR2 of the second large group LGR2 may each include third cell plugs PL3 and fourth cell plugs PL4.

The first cell plugs PL1 may be arranged in a line in a third direction III. The second cell plugs PL2 may be arranged in a line in the third direction III. The first cell plugs PL1 and the second cell plugs PL2 may be arranged in a zigzag pattern. The third cell plugs PL3 may be arranged in a line in the third direction III. The fourth cell plugs PL4 may be arranged in a line in the third direction III. The third cell plugs PL3 and the fourth cell plugs PL4 may be arranged in a zigzag pattern. The second cell plugs PL2 and the third cell plugs PL3 are disposed adjacent to the isolation insulating layer 119, and are disposed between the first cell plugs PL1 and the fourth cell plugs PL4.

Figure 8A:
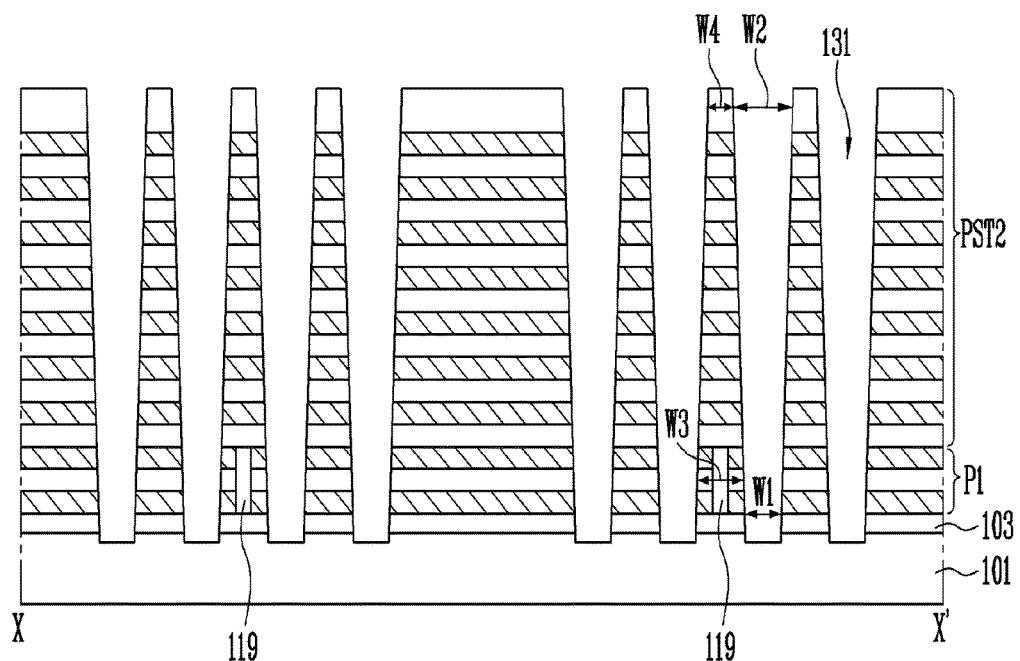
Figure 8B:
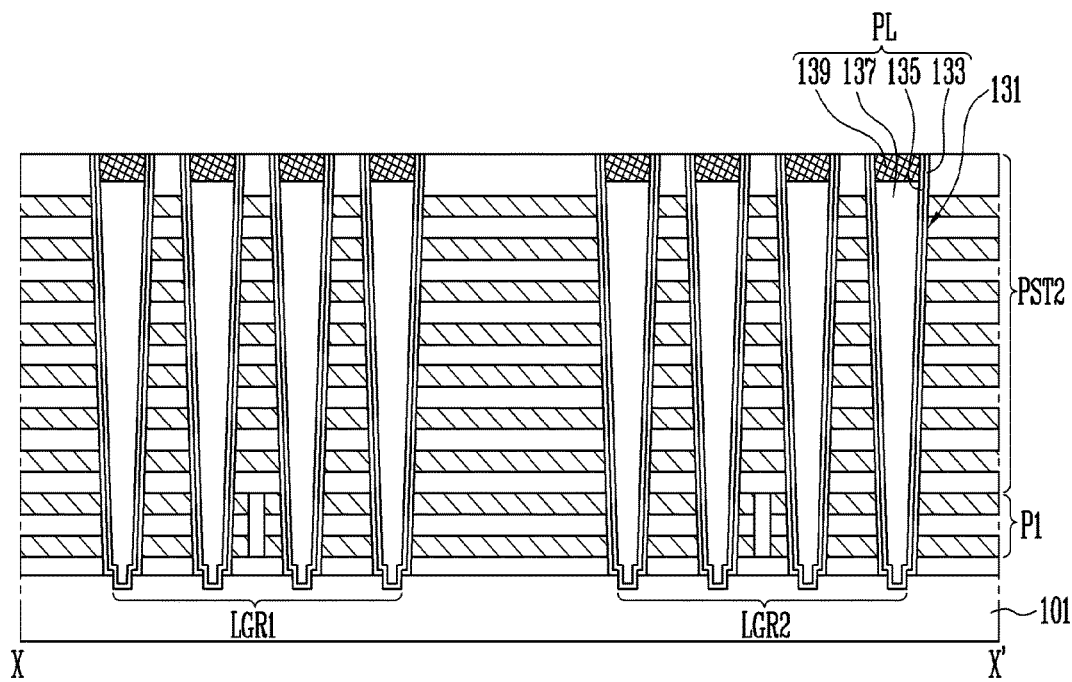

FIGS. 8A and 8B illustrates process sectional views taken along line "X-X'" shown in FIG. 7.

Referring to FIG. 8A, the step ST5 may include a step of forming holes 131 that penetrate the second stack structure PST2, the first patterns P1, and the gate insulating layer 103. The holes 131 are formed to expose the source region 101.

The holes 131 define spaces in which the cell plugs PL shown in FIG. 7 are disposed. Hereinafter, for convenience of description, a portion close to the source region 101 in each of the holes 131 is defined as a lower portion, and a portion more distant from the source region 101 than the lower portion is defined as an upper portion. Due to characteristics of an etching process for forming the holes 131, the width W1 of the lower portion in each of the holes 131 is formed narrower than that the width W2 of the upper portion in each of the holes 131. Therefore, each of the holes 131 may have a longitudinal sectional structure of an inverse trapezoid, and a distance W3 between the lower portions of the holes 131 is wider than a distance W4 between the upper portions of the holes 131. That is, the width W3 of the first pattern P1 remaining between lower portions of adjacent holes 131 is greater than the width W4 of the second stack structure PST2 remaining between upper portions of the adjacent holes 131.

The isolation insulating layer 119 according to an embodiment of the present disclosure may be disposed between lower portions of the holes 131 which may be spaced apart from each other at a greater distance than the upper portions of the holes 131. Accordingly, although the distance between upper portions of the holes 131 is minimized, the space in which the isolation insulating layer 119 is disposed can be sufficiently secured.

Referring to FIG. 8B, the step ST5 may include a step of forming a multi-layered memory layer on the surface of each of the holes 131 and a step of forming the multi-layered memory pattern 133 that exposes the source region 101 through the holes 131 by etching the multi-layered memory layer through an etching process such as an etch-back process. The multi-layered memory layer may be formed by sequentially stacking a blocking insulating layer, a data storage layer, and a tunnel insulating layer.

The step ST5 may include a step of forming the channel layer 135 on the multi-layered memory pattern 133. The channel layer 135 is formed in each of the holes 131. The channel layer 135 may be formed to completely fill in each of the holes 131, or may be formed to open a central region of each of the holes 131.

When the central region of each of the holes 131 is opened by the channel layer 135, the step ST5 may further include a step of filling a core insulating layer 137 in the central region of each of the holes 131.

The step ST5 may further include a step of forming the capping pattern 139 on the core insulating layer 137. To this end, an upper end of each of the holes 131 may be opened by recessing an upper end of the core insulating layer 137. Accordingly, the height of the core insulating layer 137 can be formed lower than the height of each of the holes 131 and the height of the channel layer 135. Subsequently, the capping pattern 139 filled in the upper end of each of the holes 131 may be formed on the core insulating layer 137 having a lowered height. The capping pattern 139 may be formed of a doped silicon layer including a first conductivity type impurity.

Cell plugs PL may be formed through the above-described process. The cell plugs PL may be divided into a first large group LGR1 and a second large group LGR2 as illustrated in FIG. 7. The channel layers 135 of the cell plugs PL may be in direct contact with the source region 101. Each of the channel layers 135 of the cell plugs PL may include a lower portion that penetrates the first patterns P1 and an upper portion that penetrates the second stack structure PST2. In an embodiment of the present disclosure, the lower portion of each of the channel layers 135 may be formed narrower than the upper portion of each of the channel layers 135. That is, the distance between the lower portions of the channel layers 135 may be greater than a distance between the upper portions of the channel layers 135.

Referring to FIG. 4, after the step ST5, the step ST7 of forming a gate stack structure by using the first pattern and the second stack structure may be performed. Subsequently, the step ST9 of forming a source contact line that is insulated from the gate stack structure and is connected to the source region may be performed.

Figure 9A:
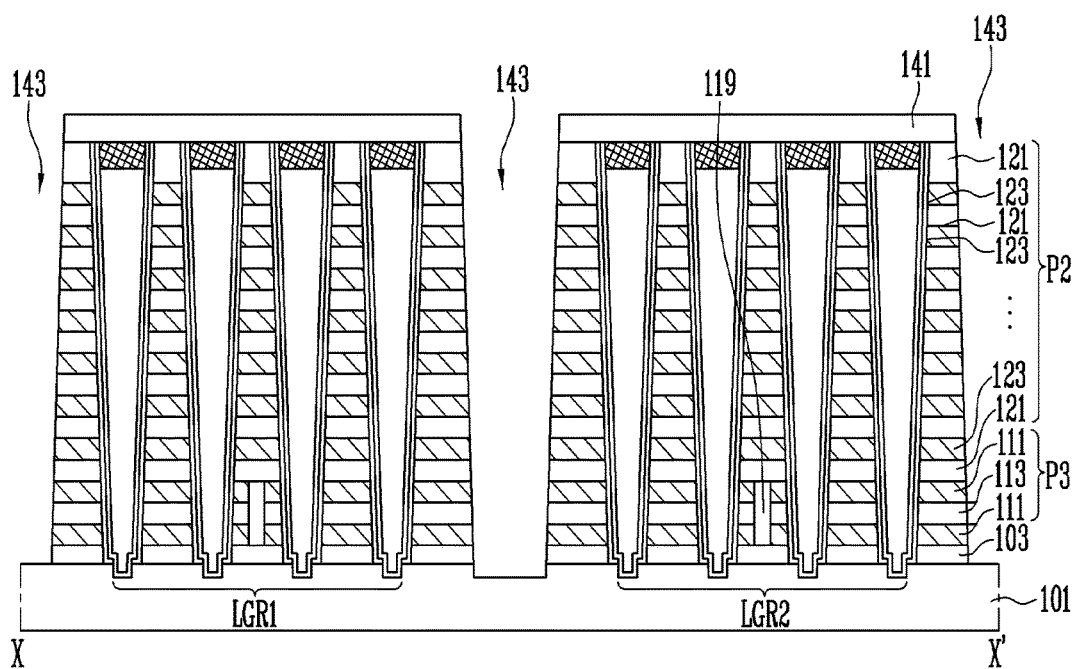
Figure 9B:
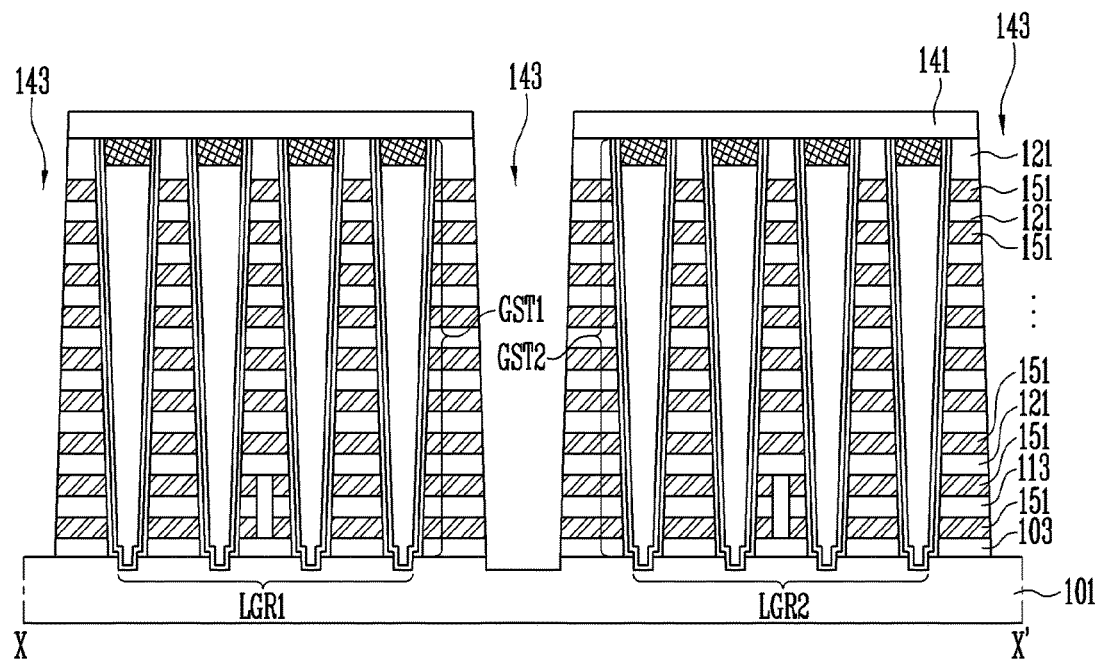
Figure 9C:
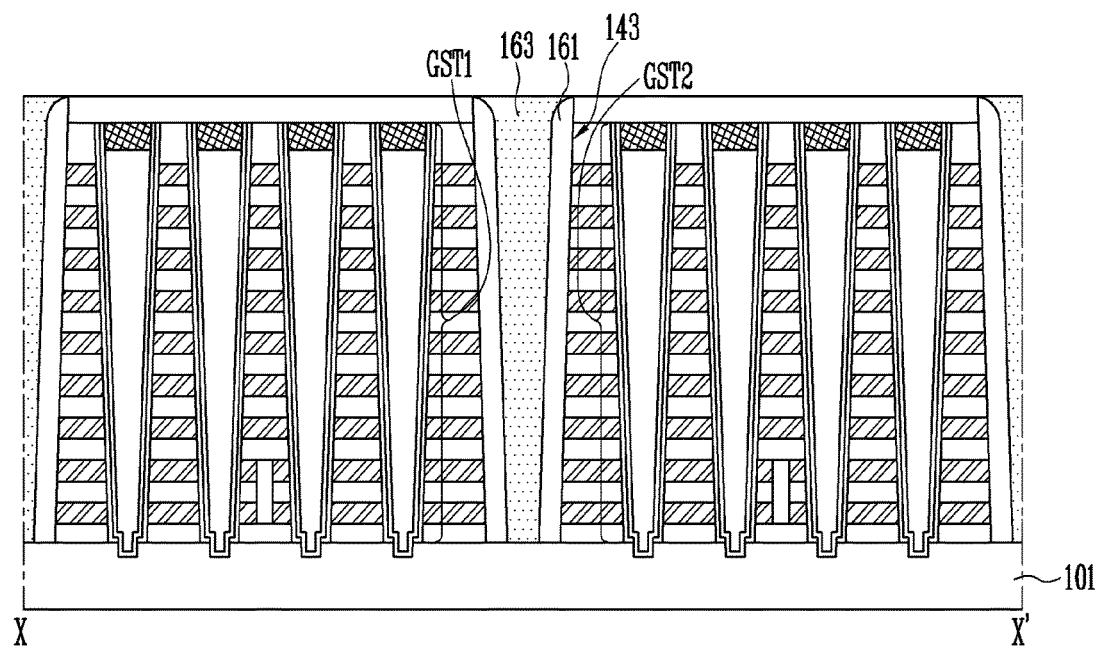

FIGS. 9A to 9C are process sectional views illustrating the steps ST7 and ST9 shown in FIG. 4. FIGS. 9A to 9C are sectional views taken along line "X-X'" shown in FIG. 7.

Referring to FIG. 9A, in the step ST7, slits 143 are formed, which penetrate the third and fourth material layers 121 and 123, the first and second material layers 111 and 113, and the gate insulating layer 103. Each of the slits 143 is disposed between the first large group LGR1 and the second large group LGR2. The slit 143 extends in the third direction III. The isolation insulating layers 119 are disposed between adjacent slits 143.

Although not shown in the drawing, before the slits 143 are formed, at least one side of a stack including the first to fourth material layers 111, 113, 121, and 123 may be patterned in a step shape. The first to fourth material layers 111, 113, 121, and 123 patterned in the step shape may be covered by a first upper insulating layer 141, and the first upper insulating layer 141 is penetrated by the slit 143.

The second stack structure including the third and fourth material layers 121 and 123 may be separated into second patterns P2 by the slits 143. The first pattern between adjacent isolation insulating layers 119 may be separated into third patterns P3 by each slit 143. Each of the third patterns P3 is defined by the first and second material layers 111 and 113 that remain between the isolation insulating layer 119 and the slit 143. The third patterns P3 on different sides of the isolation insulation layer 119 may be opposite each other.

The source region 101 may be exposed through the slits 143 penetrating the gate insulating layer 103. Sidewalls of the first to fourth material layers 111, 113, 121, and 123 are exposed by the slits 143.

In a first case where the first and fourth material layers 111 and 123 are formed of an insulating material for sacrificial layers and the second and third material layers 113 and 121 are formed as interlayer insulating layers, the step ST7 may further include a process which will be described later in reference to FIG. 9B.

In a second case where the first and fourth material layers 111 and 123 are formed of a conductive material for gate groups and the second and third material layers are formed as interlayer insulating layers, the process which will be described later in reference to FIG. 9B is omitted, and the step ST9 which will be described later in reference to FIG. 9C may be performed.

Although not shown in the drawing, in a third case where the first and fourth material layers 111 and 123 are formed of a conductive material for gate groups and the second and third material layers 113 and 121 are formed of a conductive material for sacrificial layers, the step ST9 which will be described later in reference to FIG. 9C may be performed after a process of replacing the second and third material layers 113 and 121 with interlayer insulating layers is performed.

Referring to FIG. 9B, in the above-described first case, the step ST7 may include a replace step of replacing the first and fourth material layers 111 and 123 with conductive patterns 151 for gate groups. The replace step may include a step of opening horizontal spaces by selectively removing the first and fourth material layers 111 and 123 through the slits 143. The horizontal spaces are defined between the second and third materials 113 and 121 and insulating layers including the gate insulating layer 103. Subsequently, the replace step may include a step forming a conductive layer to be filled in the horizontal spaces and a step of separating the conductive layer into the conductive patterns 151 by removing portions of the conductive layer, which are formed in the slits 143. Before the conductive layer is formed, a second blocking insulating layer may be further formed along surfaces of the horizontal spaces.

A first gate stack structure GTS1 and a second gate stack structure GST2, which are separated by the slit 143, may be defined by performing various processes as described above. The first gate stack structure GST1 surrounds the cell plugs of the first large group LGR1, and the second gate stack structure GST2 surrounds the cell plugs of the second large group LGR2.

Referring to FIG. 9C, the step ST9 performed after the step ST7 may include a step of forming spacer insulating layers 161 on sidewalls of each slit 143 and a step of forming a source contact line 163 filled in the slit 143 between the spacer insulating layers 161.

The step of forming the spacer insulating layers 161 on the sidewalls of the slit 143 may include a step of depositing an insulating layer along the surface of the slit 143 and a step of etching the insulating layer such that the source region 101 is exposed through the bottom surface of the slit 143.

The source contact line 163 may include at least one of a doped silicon layer, a metal silicide layer, and a metal layer. The source contact line 163 may be in direct contact with the source region 101. The source contact line 163 extends in the third direction III.

Referring to FIG. 4, after the step ST9, the step ST11 of forming bit lines connected to the cell plugs may be performed. Hereinafter, the step ST11 and the bit lines formed through step ST11 will be described in more detail with reference to FIGS. 10 and 11.

Figure 10:
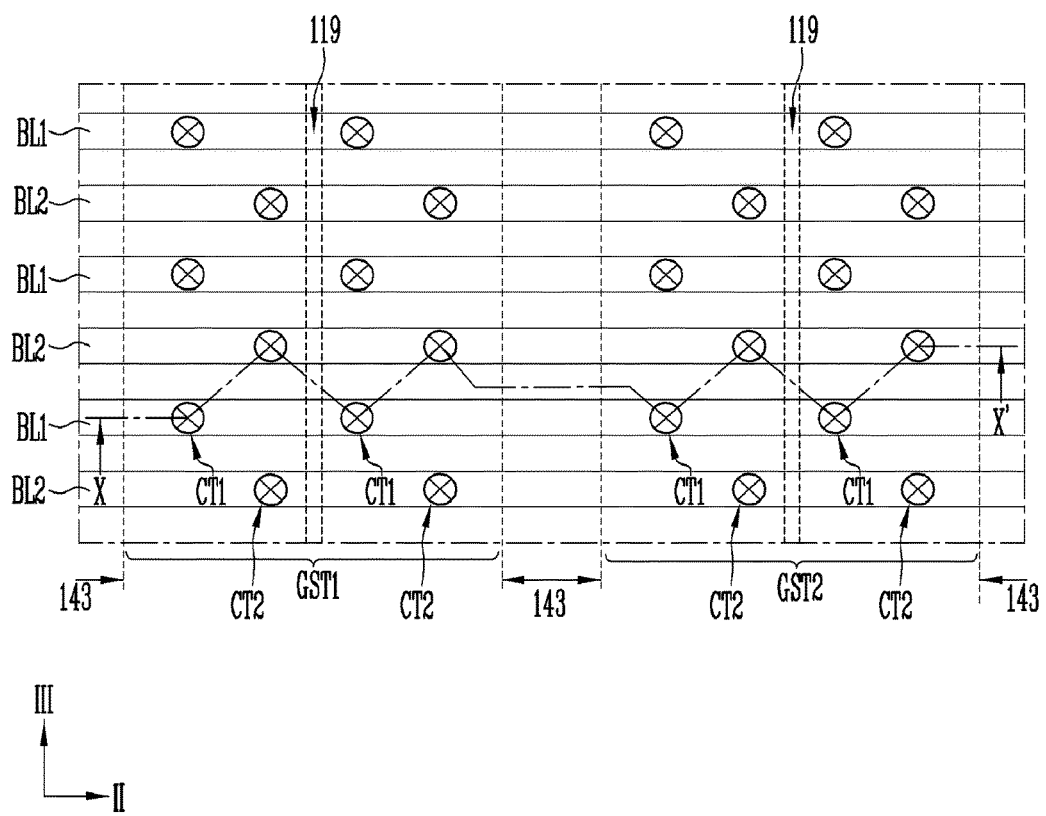

FIG. 10 shows a plan view illustrating an arrangement of the bit lines formed through the step ST11 shown in FIG. 4.

Referring to FIG. 10, the slits 143 and the isolation insulating layers 119 may extend in the third direction III, and may be alternately disposed in the second direction II. First and second bit lines BL1 and BL2 may be formed, through the step ST11, on the first gate stack structure GST1 and the second gate stack structure GST2, which are separated by the slits 143.

The first and second bit lines BL1 and BL2 may be alternately disposed in the third direction III. Each of the first and second bit lines BL1 and BL2 may extend in the second direction II.

The first and second bit lines BL1 and BL2 may be connected to the channel layers of the cell plugs via first and second contact plugs CT1 and CT2. The first contact plugs CT1 are connected to the first bit lines BL1 under the first bit lines BL1, and the second contact plugs CT2 are connected to the second bit lines BL2 under the second bit lines BL2.

The first and second contact plugs CT1 and CT2 may be divided into a first large group connected to the channel layers that penetrate the first gate stack structure GST1 and a second large group connected to the channel layers that penetrate the second gate stack structure GST2.

Figure 11:
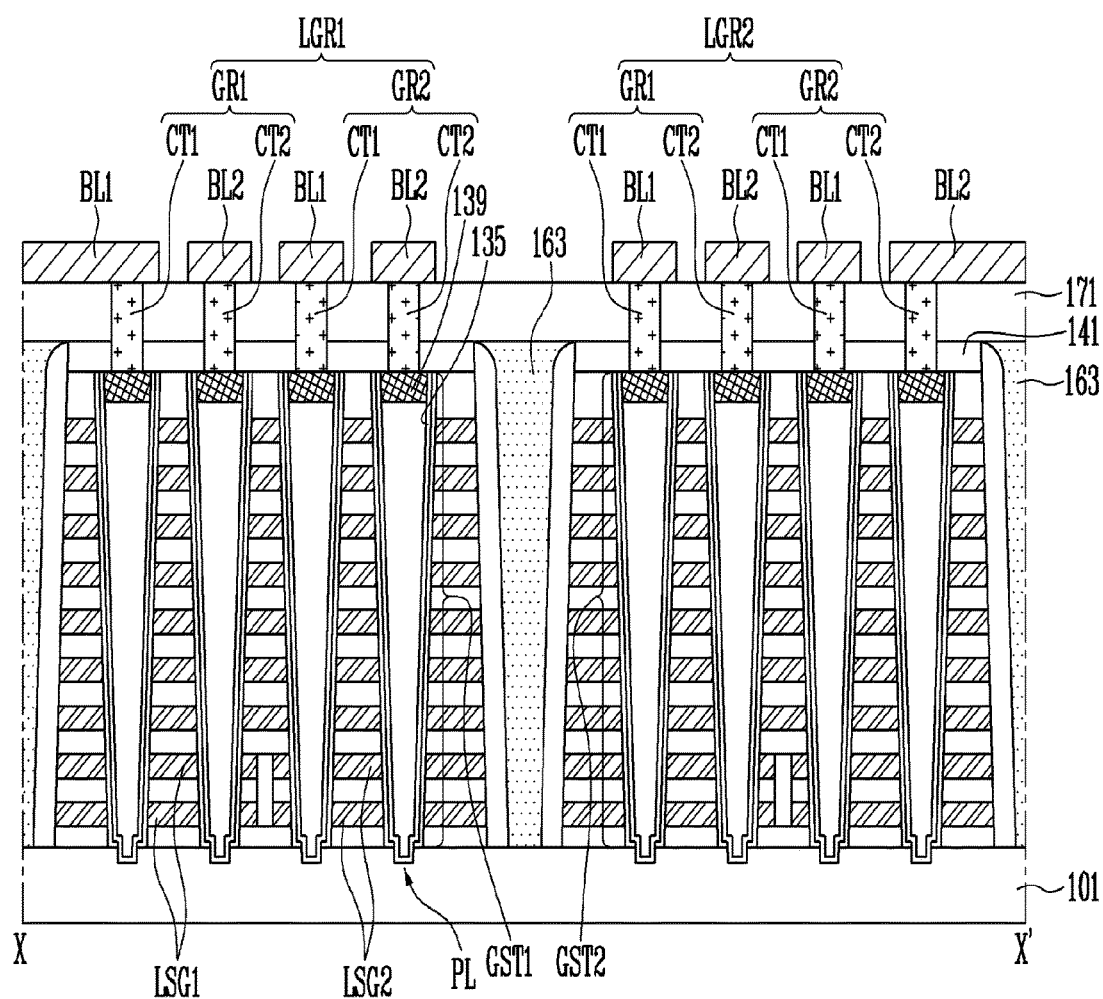

FIG. 11 shows a process sectional view taken along line "X-X'" shown in FIG. 10.

Referring to FIG. 11, the step ST11 may include a step of forming a second upper insulating layer 171 that covers the first upper insulating layer 141 penetrated by the source contact line 163, a step of forming the first and second contact plugs CT1 and CT2 connected to the capping patterns 139 and the channel layers 135 by penetrating the first and second upper insulating layers 141 and 171, and a step of forming the first and second bit lines BL1 and BL2 connected to the first and second contact plugs CT1 and CT2 on the second upper insulating layer 171. Because the first and second contact plugs CT1 and CT2 and the first and second bit lines BL1 and BL2 are patterns for transmitting an electrical signal, the first and second contact plugs CT1 and CT2 and the first and second bit lines BL1 and BL2 are formed of a conductive material.

The first and second contact plugs CT1 and CT2 may be divided into a first large group LGR1 related to an operation of cell plugs PL connected to the first gate stack structure GST1, and a second large group LGR2 related to an operation of cell plugs PL connected to the second gate stack structure GST2.

Each of the first large group LGR1 and the second large group LGR2 may include first and second contact plugs CT1 and CT2 of a first group GR1 related to an operation of cell plugs PL connected to a first lower select group LSG1, and first and second contact plugs CT1 and CT2 of a second group GR2 related to an operation of cell plugs PL connected to a second lower select group LSG2.

Figure 12A:
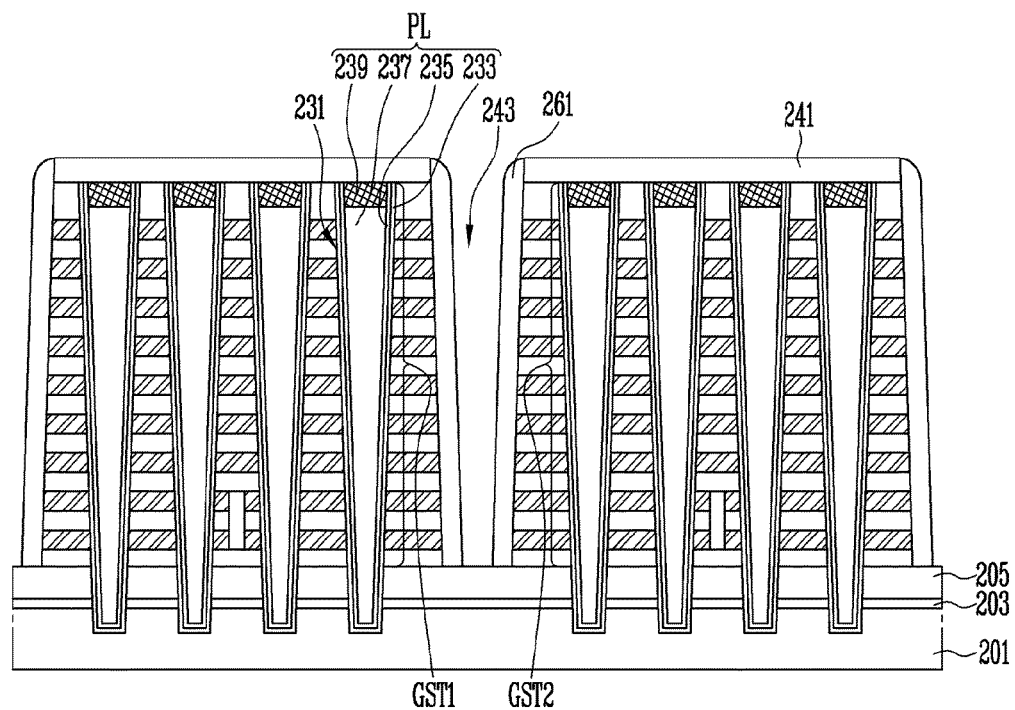
FIGS. 12A to 12C show sectional views illustrating a semiconductor device and a manufacturing method thereof according to an embodiment of the present disclosure.
Figure 12B:
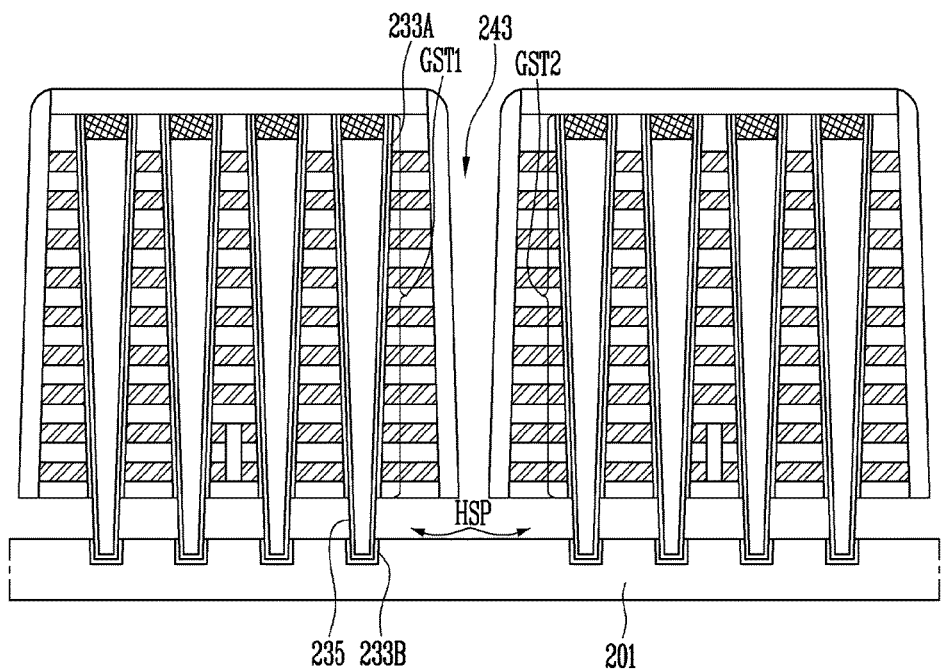
Figure 12C:
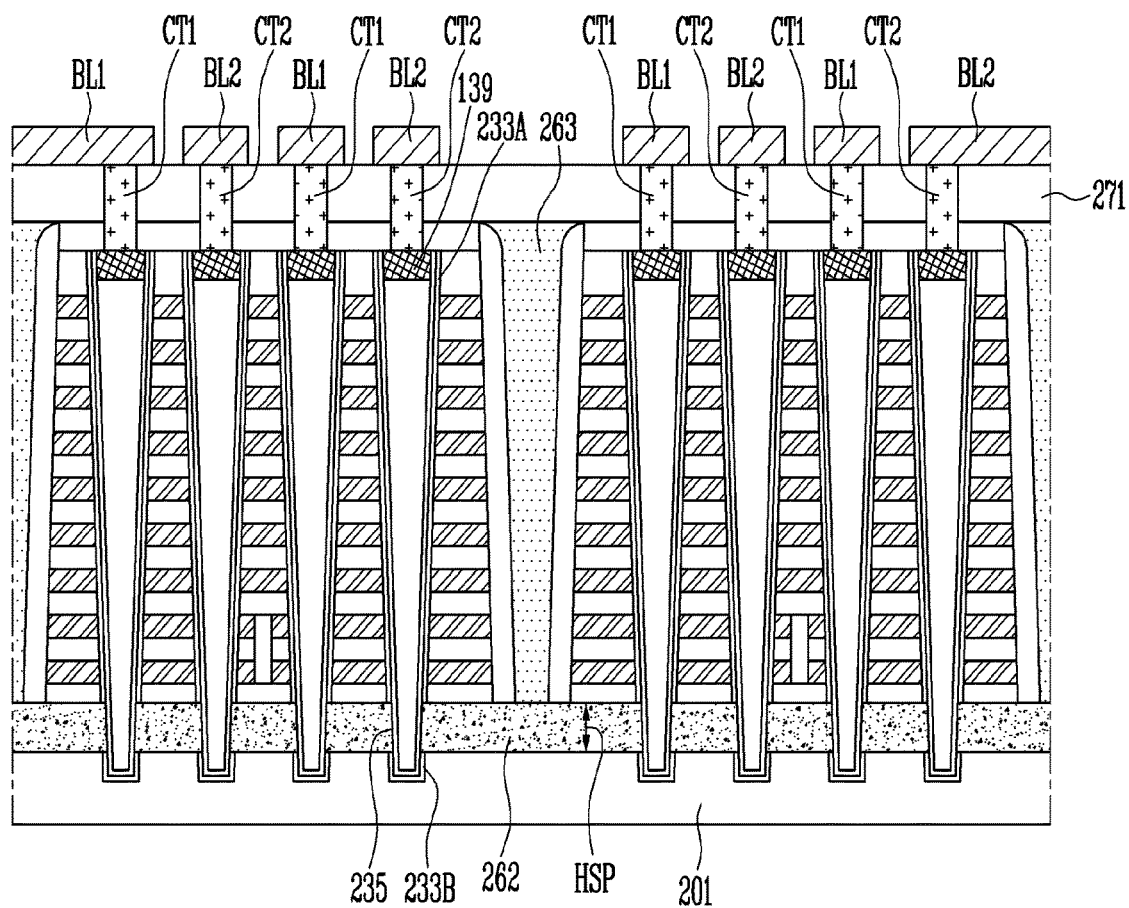

FIGS. 12A to 12C show sectional views illustrating a semiconductor device and a manufacturing method thereof according to an embodiment of the present disclosure.

Referring to FIG. 12A, before the step ST1 shown in FIG. 4 is performed, a protective layer 203 and a sacrificial source layer 205 may be formed on a source region 201. The source region 201 may be formed of a doped silicon layer including a first conductivity type impurity. The protective layer 203 may be formed of an oxide layer. The sacrificial source layer 205 may be formed of an undoped silicon layer.

Subsequently, the steps ST1 to ST7 may be performed. The steps ST1 to ST7 may be performed using the processes illustrated in FIGS. 5A to 9B.

As the steps ST1 to ST7 are performed, a first gate stack structure GST1 and a second gate stack structure GST2, each surrounding cell plugs PL separated from each other by a slit 243, may be formed on the sacrificial source layer 205. The first gate stack structure GST1 and the second gate stack structure GST2 may be covered by a first upper insulating layer 241 penetrated by the slit 243.

The cell plugs PL are formed in holes 231 that extend to the source region 201 by penetrating the first gate stack structure GST1 and the second gate stack structure GST2. Each of the cell plugs PL1 may include a multi-layered memory layer 233, a channel layer 235, a core insulating layer 237, and a capping pattern 239. The multi-layered memory layer 233 may include a blocking insulating layer, a data storage layer, and a tunnel insulating layer, which are sequentially stacked. The multi-layered memory layer 233 is formed along the surface of each of the holes 231, and extends to cover the source region 201 exposed through lower portions of the holes 231. The channel layer 235 may be formed on the surface of the multi-layered memory layer 233. The core insulating layer 237 is filled in a central region of each of the holes 231 opened by the channel layer 235, and the capping pattern 239 is filled in the central regions of each of the holes 231 opened on the core insulating layer 237.

Subsequently, spacer insulating layers 261 may be formed on sidewalls of the slit 243.

Referring to FIG. 12B, before the step ST9 shown in FIG. 4 is performed, a step of removing the sacrificial source layer exposed through the slit 243 and a step of exposing a sidewall of the channel layer 235 by removing a portion of the multi-layered memory layer exposed as the sacrificial source layer is removed may be further performed. Accordingly, the multi-layered memory layer is separated into a first multi-layered memory pattern 233A and a second multi-layered memory pattern 233B, and a horizontal space that leaves the sidewall of the channel layer 235 exposed is opened between the first and second gate stack structures GST1 and GST2 and the source region 201. As the protective layer is removed in the process of opening the horizontal space HSP, the source region 201 may be exposed.

Referring to FIG. 12C, before the step ST9 shown in FIG. 4 is performed, a contact source layer 262 that is in direct contact with the sidewall of the channel layer 235 and the source region 201, which are exposed through the horizontal space HSP, may be formed in the horizontal space HSP. The contact source layer 262 may be formed of a silicon layer. The contact source layer 262 may include a first conductivity type impurity diffused from the source region 201. Specifically, the contact source layer 262 may be a doped silicon layer including the first conductivity type impurity.

The contact source layer 262 may be formed using a selective growth technique (e.g., selective epitaxial growth (SEG)) or a non-selective deposition technique (e.g., chemical vapor deposition (CVD)).

After the contact source layer 262 is formed, a source contact line 263 filled in the slit is formed. The source contact line 263 may be in contact with the contact source layer 262.

Subsequently, a second upper insulating layer 271, first and second contact plugs CT1 and CT2, and first and second bit lines BL1 and BL2 may be formed using the processes illustrated in FIGS. 10 and 11.

FIGS. 13A to 13D show sectional views illustrating a semiconductor device and a manufacturing method thereof according to an embodiment of the present disclosure.

Figure 13A:
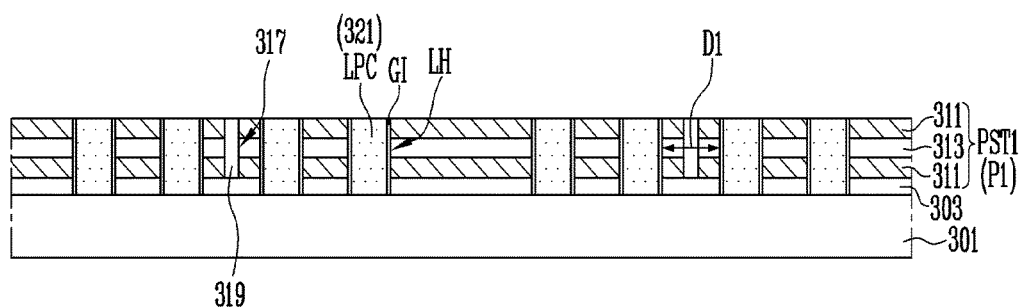
FIGS. 13A to 13D show sectional views illustrating a semiconductor device and a manufacturing method thereof according to an embodiment of the present disclosure.

Referring to FIG. 13A, a source region 301, a first gate insulating layer 303, and a first stack structure PST1 may be formed using the same processes and material layers as illustrated in FIG. 5A. Subsequently, lower plugs LPC may be formed. The lower plugs LPC penetrate the first stack structure PST1, and are in contact with the source region 301. A sidewall of each of the lower plugs LPC is surrounded by a second gate insulating layer GI. Each of the lower plugs LPC may be used as a channel layer of a source select transistor.

The step of forming the lower plugs LPC may include a step of forming lower holes LH that penetrate first material layers 311 and second material layers 313 of the first stack structure PST1 and leave the source region 301 exposed, a step of forming the second gate insulating layer GI on a sidewall of each of the lower holes LH, and a step of filling a first semiconductor layer 321 in the lower holes LH. The first semiconductor layer 321 may be formed as a silicon layer. The first semiconductor layer 321 may include at least one of an undoped silicon layer and a doped silicon layer. An n-type dopant may be dispersed in the doped silicon layer. The first semiconductor layer 321 may be formed using deposition of epitaxial growth. The second gate insulating layer GI may be formed of an insulating material such as a silicon oxide layer.

Subsequently, a slit 317 is formed using the same process as illustrated in FIG. 5A, and the first stack structure PST1 is separated into first patterns P1 through the slit 317. Subsequently, an isolation insulating layer 319 is formed in the slit 317, using the same process as illustrated in FIG. 5B.

The lower holes LH, the second gate insulating layer GI, and the lower plugs LPC may be formed before the process of forming the slit 317, or may be formed after the process of forming isolation insulating layer 319. Lower holes LH adjacent to each other with the isolation insulating layer 319 interposed between the lower holes LH may be spaced apart from each other at a first distance D1 by considering a space in which the isolation insulating layer 319 is to be disposed. The lower plugs LPC may be formed in the lower holes LH before a second stack structure. Because the lower holes LH are formed by etching the first stack structure PST1 formed with a low height, the width of each of the lower holes LH is not excessively widened during the etching process. Thus, the space in which the isolation insulating layer 319 is to be disposed between the lower holes LH can be sufficiently secured.

Figure 13B:
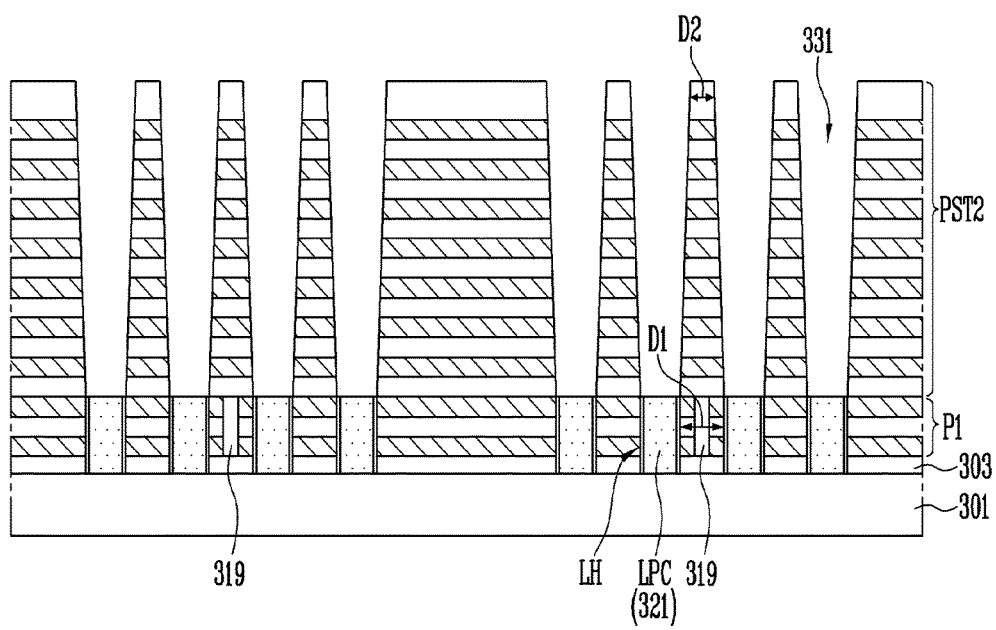

Referring to FIG. 13B, the second stack structure PST2 is formed on the first patterns P1, the lower plugs LPC, and the isolation insulating layer 319. The second stack structure PST2 may be formed using the same processes and material layers as illustrated in FIG. 6.

Subsequently, upper holes 331 penetrating the second stack structure PST2 are formed. The upper holes 331 expose the lower plugs LPC. The upper holes 331 define spaces in which cell plugs PL to be formed in a subsequent process are to be disposed. Due to characteristics of a manufacturing process of the semiconductor device as illustrated in FIG. 8A, the internal diameter of each of the upper holes 331 may become narrower as the upper holes 331 become closer to the lower plugs LPC. Therefore, the upper holes 331 may have a longitudinal sectional structure having an inverse trapezoidal shape. In addition, a second distance D2 between the upper holes 131 aligned on the isolation insulating layers 319 may be narrower than the first distance D1. According to this embodiment, because the isolation insulating layers 319 are not disposed within the second distance D2, the manufacturing processes of the semiconductor device may be easier.

The arrangement of the lower plugs LPC and the arrangement of the upper holes 331 may be the same as that of the cell plugs PL shown in FIG. 7

Figure 13C:
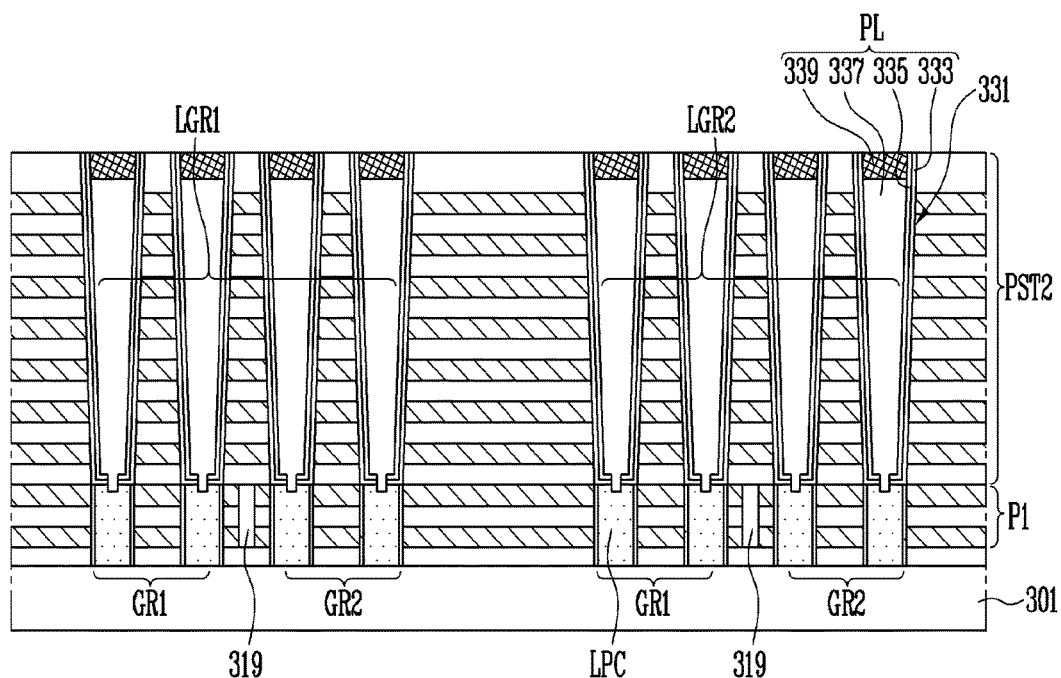

Referring to FIG. 13C, cell plugs PL are formed in the upper holes 331. Each of the cell plugs PL may include a multi-layered memory pattern 333, a second semiconductor layer 335 used as a channel layer, and a capping pattern 339.

The multi-layered memory pattern 333 may include a blocking insulating layer, a data storage layer, and a tunnel insulating layer as illustrated in FIG. 3A. The multi-layered memory pattern 333 surrounds a sidewall of the second semiconductor layer 335.

The second semiconductor layer 335 surrounds a core insulating layer 337 disposed in a central region of each of the upper holes 331, and penetrates the multi-layered memory pattern 333. The second semiconductor layer 335 is formed along a surface of an upper hole 331 corresponding to the upper hole 331, and is connected to a lower plug LPC corresponding thereto.

The cell plugs PL may be formed using the same processes and material layers as illustrated in FIG. 8B. The cell plugs PL and the lower plugs LPC may be divided into a first large group LGR1 and a second large group LGR2. The lower plugs LP of each of the first large group LGR1 and the second large group LGR2 may be separated into a first group GR1 and a second group GR2. Each of the isolation insulating layers 319 extends along a boundary between the first group GR1 and the second group GR2.

Figure 13D:
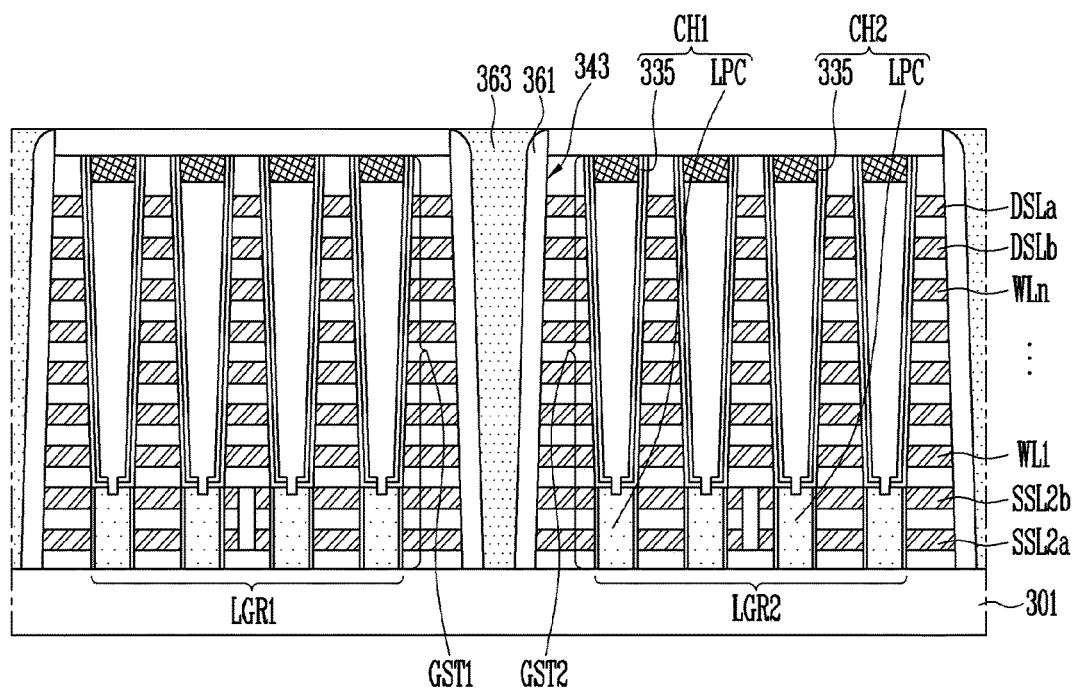

Referring to FIG. 13D, gate stack structures GST1 and GST2 separated by a slit 343 are formed using the same processes as illustrated in FIGS. 9A and 9B.

Each of the gate stack structures GST1 and GST2, as illustrated in FIG. 2, includes drain select lines DSLa and DSLb, word lines WL1 to WLn, first source select lines SSL1a and SSL1b, and second source select lines SSL2a and SSL2b.

The slit 343 is disposed between the first large group LGR1 and the second large group LGR2, and exposes the source region 301.

Subsequently, a spacer insulating layer 361 is formed on a sidewall of the slit 343, using the process illustrated in FIG. 9C, and a source contact line 363 connected to the source region 301 is formed on the spacer insulating layer 361 in the slit 343.

According to the above-described processes, the lower plug LPC penetrating the first source select lines SSL1a and SSL1b and the second semiconductor layer 335 that is connected to the lower plug LPC and penetrates the word lines WL1 to WLn and the drain select lines DSLa and DSLb may constitute a first channel layer CH1. In addition, the lower plug LPC penetrating the second source select lines SSL2a and SSL2b and the second semiconductor layer 335 that is connected to the lower plug LPC and penetrates the word lines WL1 to WLn and the drain select lines DSLa and DSLb may constitute a second channel layer CH2.

After the source contact line 363 is formed, the processes illustrated in FIGS. 10 and 11 may be performed.

According to the present disclosure, the isolation region of the select lines is designed by considering the profile of a channel layer, so that the select lines can be stably separated without increasing any horizontal area. Accordingly, in the present disclosure, it is possible to reduce the area of a cell array region in the three-dimensional semiconductor device.

Figure 14:
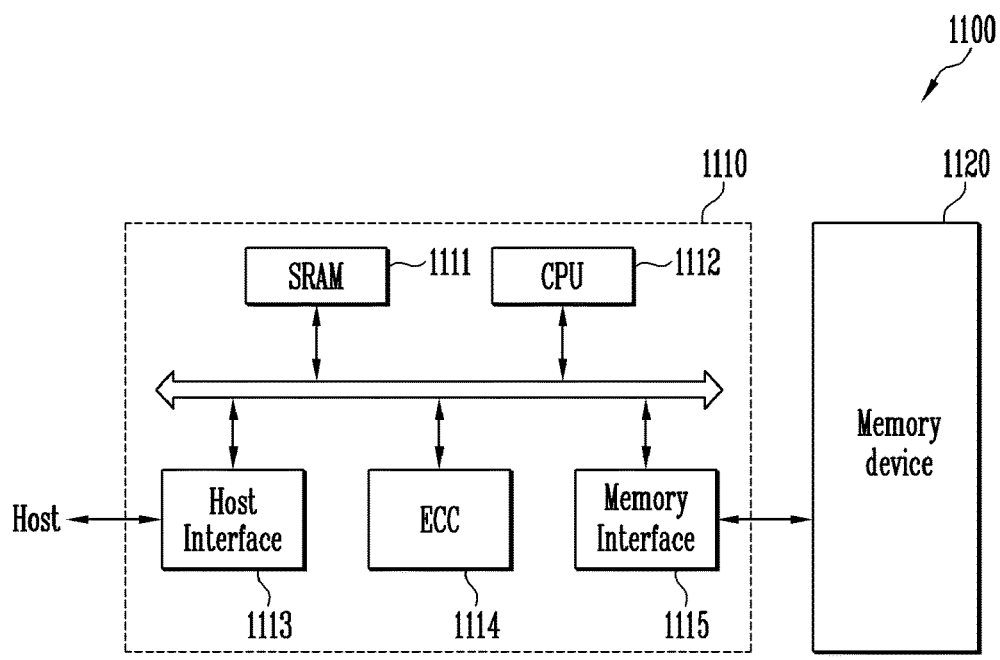
FIG. 14 shows a block diagram illustrating a configuration of a memory system according to an embodiment of the present disclosure.

FIG. 14 shows a block diagram illustrating a configuration of a memory system according to an embodiment of the present disclosure.

Referring to FIG. 14, the memory system 1100 according to the embodiment of the present disclosure includes a memory device 1120 and a memory controller 1110.

The memory device 1120 may constitute the circuit illustrated in FIG. 1, and include the structure illustrated in FIG. 2. The memory device 1120 may include the structure illustrated in FIG. 12C. The memory device 1120 may include the structure illustrated in FIG. 13D. More specifically, the memory device 1120 may include memory strings of first and second groups, which are shared by an upper select group and word lines. The memory strings of the first group and the memory strings of the second group are controlled by a first lower select group and a second lower select group, which are separated from each other. The first lower select group and the second lower select group are formed to surround lower ends of channel layers, which have a width relatively narrower than that of upper ends of channel layers surrounded by the upper select group. The memory device 1120 may be a multi-chip package configured with a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1100 may communicated with the outside (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 15:
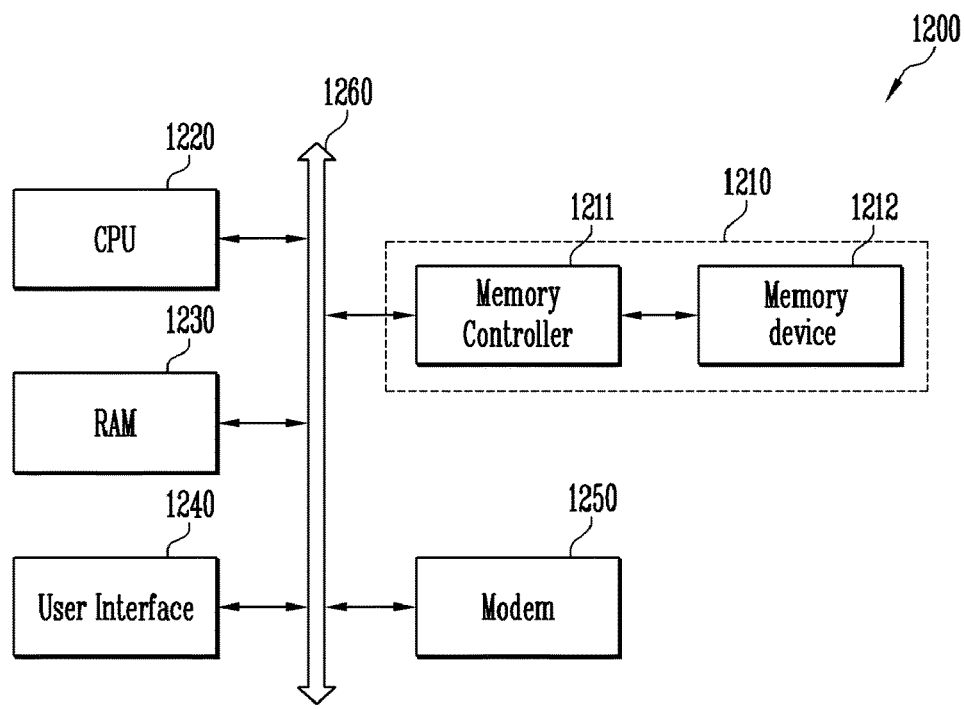
FIG. 15 shows a block diagram illustrating a configuration of a computing system according to an embodiment of the present disclosure.

FIG. 15 shows a block diagram illustrating a configuration of a computing system according to an embodiment of the present disclosure.

Referring to FIG. 15, the computing system 1200 according to the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 14, may be configured with a memory device 1212 and a memory controller 1211.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
    first channel layers and second channel layers, connected between a source region and bit lines;
    word lines stacked and spaced apart from each other between the source region and the bit lines, the word lines each extending to surround the first and second channel layers;
    a first source select line surrounding the first channel layers between the word lines and the source region;
    a second source select line surrounding the second channel layers between the word lines and the source region, the second source select line and the first source select line spaced apart from each other between the first channel layers and the second channel layers; and
    a drain select line disposed between the bit lines and the word lines, the drain select line extending to overlap the first and second source select lines.

2. The semiconductor device of claim 1, wherein the first source select line and the second source select line are disposed in a same layer.

3. The semiconductor device of claim 1, wherein a total number of the first and second channel layers surrounded by each word line is equal to the number of first and second channel layers surrounded by the drain select line, and is two times the total number of the first channel layers surrounded by the first source select line or two times the total number of the second channel layers surrounded by the second source select line.

4. The semiconductor device of claim 1, wherein a distance between adjacent first and second channel layers increases as the first and second channel layers approach the source region.

5. The semiconductor device of claim 1, further comprising an isolation insulating layer covered by the word lines, wherein the first source select line is separated from the second source select line by the isolation insulating layer.

6. The semiconductor device of claim 1, wherein at least one of the first channel layers and at least one of the second channel layers are commonly connected to any one of the bit lines.

7. The semiconductor device of claim 1, further comprising source contact lines connected to the source region, wherein the word lines, the drain select line, and the first and second source select lines are disposed between adjacent source contact lines.

8. The semiconductor device of claim 1, wherein each of the first channel layers and the second channel layers includes:
    a first semiconductor layer filled in a lower hole that penetrates the first source select line or the second source select line; and
    a second semiconductor layer formed along a surface of an upper hole that penetrates the word lines, the second semiconductor layer connected to the first semiconductor layer.

9. A semiconductor device comprising:
    first channel layers and second channel layers, connected between a source region and bit lines;
    word lines stacked and spaced apart from each other between the source region and the bit lines, the word lines each extending to surround the first and second channel layers;
    a first source select line surrounding the first channel layers between the word lines and the source region;
    a second source select line surrounding the second channel layers between the word lines and the source region, the second source select line disposed to be spaced apart from the first source select line; and
    a drain select line disposed between the bit lines and the word lines, the drain select line extending to overlap the first and second source select lines,
    wherein each of the first source select line and the second source select line has a narrower width than each of the word lines and the drain select line.

10. The semiconductor device of claim 9, wherein the first source select line and the second source select line are disposed in a same layer.

11. The semiconductor device of claim 9, wherein a total number of the first and second channel layers surrounded by each word line is equal to the number of first and second channel layers surrounded by the drain select line, and is two times the total number of the first channel layers surrounded by the first source select line or two times the total number of the second channel layers surrounded by the second source select line.

12. The semiconductor device of claim 9, wherein a distance between adjacent first and second channel layers increases as the first and second channel layers approach the source region.

13. The semiconductor device of claim 9, wherein at least one of the first channel layers and at least one of the second channel layers are commonly connected to any one of the bit lines.

14. The semiconductor device of claim 9, further comprising source contact lines connected to the source region, wherein the word lines, the drain select line, and the first and second source select lines are disposed between adjacent source contact lines.

15. The semiconductor device of claim 9, wherein each of the first channel layers and the second channel layers includes:
    a first semiconductor layer filled in a lower hole that penetrates the first source select line or the second source select line; and
    a second semiconductor layer formed along a surface of an upper hole that penetrates the word lines, the second semiconductor layer connected to the first semiconductor layer.

16. A semiconductor device comprising:
    a first channel layer and a second channel layer, each extending from an upper portion to a lower portion, the first channel layer and the second channel layer, each having a longitudinal sectional structure of which width becomes narrower as the structure comes closer to the lower portion;

word lines stacked toward the upper portion from the lower portion, the word lines spaced apart from each other, the word lines each extending to surround the first channel layer and the second channel layer;

a first lower select group surrounding a portion of the first channel layer that further protrudes toward the lower portion than the word lines;

a second lower select group surrounding a portion of the second channel layer that further protrudes toward the lower portion than the word lines; and an isolation insulating layer disposed between the first lower select group and the second lower select group, the isolation insulating layer covered by the word lines.

17. The semiconductor device of claim 16, comprising an upper select group extending to surround a portion of the first channel layer and a portion of the second channel layer, which protrude farther toward the upper portion than the word lines.

18. The semiconductor device of claim 16, further comprising a bit line commonly connected to the first channel layer and the second channel layer.

19. The semiconductor device of claim 16, further comprising a source region commonly connected to the first channel layer and the second channel layer.

20. The semiconductor device of claim 16, wherein the longitudinal sectional structure has a shape of an inverse trapezoid.

* * * * *